United States Patent
Kawakami et al.

(10) Patent No.: US 7,883,788 B2
(45) Date of Patent: Feb. 8, 2011

(54) LIGHT EMITTING ELEMENT, LIGHT EMITTING DEVICE, AND ELECTRONIC DEVICE

(75) Inventors: Takahiro Kawakami, Isehara (JP); Tomoya Aoyama, Atsugi (JP); Junichiro Sakata, Atsugi (JP); Hisao Ikeda, Atsugi (JP); Satoshi Seo, Kawasaki (JP); Yuji Iwaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/859,811

(22) Filed: Aug. 20, 2010

(65) Prior Publication Data

US 2010/0308320 A1    Dec. 9, 2010

Related U.S. Application Data

(62) Division of application No. 11/435,996, filed on May 18, 2006, now Pat. No. 7,790,296.

(30) Foreign Application Priority Data

May 20, 2005   (JP)   .............................. 2005-147967

(51) Int. Cl.
    *H05B 33/12*   (2006.01)
(52) U.S. Cl. ........................ 428/690; 313/483; 313/496; 313/506
(58) Field of Classification Search ................. 313/483, 313/498–506; 428/690
    See application file for complete search history.

(56) References Cited

U.S. PATENT DOCUMENTS 5,404,075 A    4/1995    Fujikawa et al.

(Continued)

FOREIGN PATENT DOCUMENTS

EP    0 855 848    7/1998

(Continued)

OTHER PUBLICATIONS

Y. Yang et al. "Polyaniline as a Transparent Electrode for Polymer Light-Emitting Diodes: Lower Operating Voltage and Higher Efficiency," Applied Physics Letters, 1994, vol. 64, pp. 1245-1247.

(Continued)

*Primary Examiner*—David Wu
*Assistant Examiner*—Vu A Nguyen
(74) *Attorney, Agent, or Firm*—Eric J. Robinson; Robinson Intellectual Property Law Office, P.C.

(57) ABSTRACT

It is an object of the present invention to provide a functional layer for protecting a light emitting element from being deteriorated by a physical or chemical influence when the light emitting element is manufactured or driven, and to attain extension of lifetime of an element and improvement of element characteristics without increasing a drive voltage and degrading transmittance and color purity by providing such a functional layer. One feature of the present invention is to provide a buffer layer made of a composite material for a light emitting element including aromatic hydrocarbon containing at least one vinyl skeleton and metal oxide in part of a light emitting substance containing layer, in the light emitting element fowled by interposing the light emitting substance containing layer between a pair of electrodes. The composite material for a light emitting element for forming the buffer layer of the present invention has high conductivity and is superior in transparency.

24 Claims, 9 Drawing Sheets

U.S. PATENT DOCUMENTS

| | | | |
|---|---|---|---|
| 5,989,737 A | 11/1999 | Xie et al. | |
| 6,013,384 A | 1/2000 | Kido et al. | |
| 6,361,886 B2 | 3/2002 | Shi et al. | |
| 6,380,687 B1 | 4/2002 | Yamazaki | |
| 6,423,429 B2 | 7/2002 | Kido et al. | |
| 6,483,236 B1 | 11/2002 | Hung | |
| 6,486,601 B1 | 11/2002 | Sakai et al. | |
| 6,489,638 B2 | 12/2002 | Seo et al. | |
| 6,518,700 B1 | 2/2003 | Friend et al. | |
| 6,552,496 B2 | 4/2003 | Yamazaki | |
| 6,589,673 B1 | 7/2003 | Kido et al. | |
| 6,593,691 B2 | 7/2003 | Nishi et al. | |
| 6,608,449 B2 | 8/2003 | Fukunaga | |
| 6,642,544 B1 | 11/2003 | Hamada et al. | |
| 6,690,033 B2 | 2/2004 | Yamazaki et al. | |
| 6,692,845 B2 | 2/2004 | Maruyama et al. | |
| 6,774,573 B2 | 8/2004 | Yamazaki | |
| 6,794,278 B2 | 9/2004 | Kido et al. | |
| 6,830,494 B1 | 12/2004 | Yamazaki et al. | |
| 7,074,500 B2 | 7/2006 | Pfeiffer et al. | |
| 7,141,817 B2 | 11/2006 | Nishi et al. | |
| 7,158,161 B2 | 1/2007 | Gyoutoku et al. | |
| 7,256,422 B2 | 8/2007 | Yamazaki | |
| 7,323,225 B2 | 1/2008 | Aoki et al. | |
| 7,745,991 B2 | 6/2010 | Yamazaki et al. | |
| 2001/0053559 A1 | 12/2001 | Nagao et al. | |
| 2002/0093290 A1 | 7/2002 | Yamazaki | |
| 2003/0189401 A1 | 10/2003 | Kido et al. | |
| 2005/0084712 A1 | 4/2005 | Kido et al. | |
| 2005/0084713 A1 | 4/2005 | Kido et al. | |
| 2005/0098207 A1 | 5/2005 | Matsumoto et al. | |

FOREIGN PATENT DOCUMENTS

| | | |
|---|---|---|
| EP | 0 948 063 | 10/1999 |
| EP | 1 009 198 | 6/2000 |
| EP | 1 065 723 | 1/2001 |
| EP | 1 089 361 | 4/2001 |
| EP | 1 093 167 | 4/2001 |
| EP | 1 160 891 | 12/2001 |
| EP | 1 261 042 | 11/2002 |
| EP | 1 351 558 | 10/2003 |
| EP | 1 524 706 | 4/2005 |
| EP | 1 524 707 | 4/2005 |
| EP | 1 530 245 | 5/2005 |
| JP | 01-312873 | 12/1989 |
| JP | 02-139892 | 5/1990 |
| JP | 03-114197 | 5/1991 |
| JP | 03-190088 | 8/1991 |
| JP | 03-274695 | 12/1991 |
| JP | 04-357694 | 12/1992 |
| JP | 05-182766 | 7/1993 |
| JP | 06-267658 | 9/1994 |
| JP | 06-290873 | 10/1994 |
| JP | 07-312289 | 11/1995 |
| JP | 09-063771 | 3/1997 |
| JP | 10-255985 | 9/1998 |
| JP | 10-270171 | 10/1998 |
| JP | 10-308284 | 11/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-076868 | 3/2001 |
| JP | 2001-185354 | 7/2001 |
| JP | 2001-244079 | 9/2001 |
| JP | 2002-015873 | 1/2002 |
| JP | 2002-332567 | 11/2002 |
| JP | 2002-367784 | 12/2002 |
| JP | 2003-229278 | 8/2003 |
| JP | 2003-272860 | 9/2003 |
| JP | 2004-134395 | 4/2004 |
| JP | 2004-514257 | 5/2004 |
| JP | 2004-349007 | 12/2004 |
| JP | 2005-026121 | 1/2005 |
| JP | 2005-032618 | 2/2005 |
| JP | 2005-123094 | 5/2005 |
| JP | 2005-123095 | 5/2005 |
| JP | 2005-166637 | 6/2005 |
| WO | WO 00/01203 | 1/2000 |
| WO | WO 02/41414 | 5/2002 |
| WO | WO 2005/006460 | 1/2005 |

OTHER PUBLICATIONS

S. Tokito et al., "Metal Oxides as a Hole-Injecting Layer for an Organic Electroluminescent Device," Journal of Applied Physics D, 1996, vol. 29, pp. 2750-2753.

Nakada et al, "27a-ZL-12 Multi Photon Emission Organic EL Devices Using Charge Transfer Complex as Charge Generation Layer," The 63$^{rd}$ Applied Physics-Related Combined Seminar Seminar Proceedings, Autumn Meeting, Sep. 24, 2002, p. 1165.

Tokailin et al. (Proc. SPIE 1910 (1993), 38-47).

LIGHT EMITTING ELEMENT, LIGHT EMITTING DEVICE, AND ELECTRONIC DEVICE

BACKGROUND OF THE INVENTION

1. Field of the Invention

The present invention relates to a current excitation type light emitting element in which a light emitting substance is interposed between a pair of electrodes, a light emitting device having such a light emitting element, and an electronic device.

2. Description of the Related Art

A light emitting element having features such as thin shape, lightweight, and rapid response is expected to be applied to flat panel displays of the next generation. In addition, it is said that a light emitting device in which light emitting elements are arranged in matrix is superior to a conventional liquid crystal display device in viewing angle and visibility.

A light emitting element is formed by interposing a light emitting substance containing layer between a pair of electrodes (an anode and a cathode), and it is said that emission mechanism thereof is as follows: when a voltage is applied between both electrodes, holes injected from an anode and electrons injected from a cathode are recombined in a light emitting layer in the light emitting substance containing layer, thereby forming a molecular exciton by recombination in an emission center, and energy is released when the molecular exciton returns to a ground state to emit light. By such a mechanism, such a light emitting element is referred to as a current excitation type light emitting element. A singlet excitation state and a triplet excitation state can be given as types of an excitation state formed by a light emitting substance. Light emission from a singlet excitation state is referred to as fluorescence and light emission from a triplet excitation state is referred to as phosphorescence.

There are problems such that these light emitting substances are easily deteriorated by a physical or chemical influence such as heat, moisture, and oxygen, and are easily deteriorated when the light emitting element is manufactured or driven because these light emitting substances are generally formed in a thin film state with 50 nm or less in a case of a single layer. The prevention of such deterioration of the light emitting element leads to improvement of yield and reliability of the light emitting element.

In a case where such a light emitting element is applied to a light emitting device, an electronic device, and the like, the reduction of power consumption is also given as one of the objects. It is important to reduce a drive voltage of a light emitting element in order to reduce power consumption.

In a current excitation type light emitting element, emission intensity is determined by an amount of flowing current. Therefore, it is necessary to flow a large amount of current at a low voltage in order to reduce a drive voltage.

Previously, as a method for reducing a drive voltage, an approach of providing a buffer layer between an electrode and a layer including an organic compound having a light emitting property, has been attempted. For example, it is known that a drive voltage can be reduced by providing a buffer layer which is made of polyaniline (PANI) doped with camphorsulfonic acid, between indium tin oxide (ITO) and a light emitting layer (for example, refer to Non-Patent Document 1: Y. Yang, et al. Applied Physics Letters, Vol. 64 (10), 1245-1247 (1994)). It is explained that this is because of the excellent carrier injecting property of PANI to the light emitting layer. Note that in the Non-Patent Document 1, PANI which is the buffer layer is also considered to be a part of an electrode.

However, as described in the Non-Patent Document 1, PANI has a problem that transmittance becomes lower when a film thickness becomes thick. Specifically, it is reported that, in a film thickness of about 250 nm, the transmittance is less than 70%. In other words, since the problem is with the transparency of the material itself which is used for the buffer layer, light that is generated within an element cannot be extracted efficiently.

SUMMARY OF THE INVENTION

It is an object of the present invention to provide a functional layer for protecting a light emitting element from being deteriorated by a physical or chemical influence when the light emitting element is manufactured or driven, and to attain extension of lifetime of an element and improvement of element characteristics without increasing a drive voltage and degrading transmittance and color purity by providing such a functional layer. Further, it is another object of the present invention to provide a light emitting device having such a light emitting element and an electronic device having the light emitting device.

One feature of the present invention is to provide a buffer layer made of a composite material for a light emitting element including aromatic hydrocarbon containing at least one vinyl skeleton and metal oxide in part of a light emitting substance containing layer, in the light emitting element formed by interposing the light emitting substance containing layer between a pair of electrodes. The composite material for a light emitting element for forming the buffer layer of the present invention has high conductivity and is superior in transparency.

One structure of the present invention is a light emitting element formed by interposing a light emitting substance containing layer between a pair of electrodes, in which a layer including aromatic hydrocarbon having at least one vinyl skeleton and metal oxide is provided in part of the light emitting substance containing layer.

Another structure of the present invention is a light emitting element formed by interposing a light emitting substance containing layer between a pair of electrodes, in which a layer including aromatic hydrocarbon having at least one vinyl skeleton and metal oxide is provided in part of the light emitting substance containing layer and to be in contact with one or both of the pair of electrodes.

Another structure of the present invention is a light emitting element formed by interposing a light emitting substance containing layer between an anode and a cathode, in which a buffer layer and an electron generating layer are included in part of the light emitting substance containing layer; the buffer layer includes aromatic hydrocarbon having at least one vinyl skeleton and metal oxide; the electron generating layer includes an electron transporting substance or a bipolar substance, and a substance of alkali metal, alkaline earth metal, alkali metal oxide, alkaline earth metal oxide, alkali metal fluoride, or alkaline earth metal fluoride; and the buffer layer is formed between the cathode and the electron generating layer to be in contact with each of them.

Another structure of the present invention is a light emitting element formed by interposing a light emitting substance containing layer between an anode and a cathode, in which at least a buffer layer and an electron generating layer which are formed without being in contact with the anode and the cathode are included in part of the light emitting substance containing layer; the buffer layer includes aromatic hydrocarbon containing at least one vinyl skeleton and metal oxide; the electron generating layer includes an electron transporting substance or a bipolar substance, and a substance of alkali metal, alkaline earth metal, alkali metal oxide, alkaline earth metal oxide, alkali metal fluoride, or alkaline earth metal fluoride; and the electron generating layer is formed to be closer to the cathode side than the buffer layer, and to be in contact with the buffer layer.

In each of the structures, the metal oxide is any of molybdenum oxide, vanadium oxide, ruthenium oxide, and rhenium oxide.

In each of the structures, the aromatic hydrocarbon containing at least one vinyl skeleton is represented by, for example, any of the following structural formulas (1) to (5).

[Chemical formula 1]

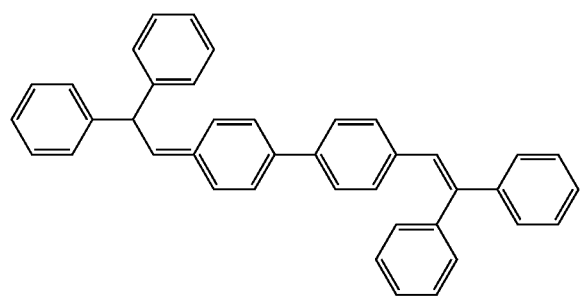

(1)

(2)

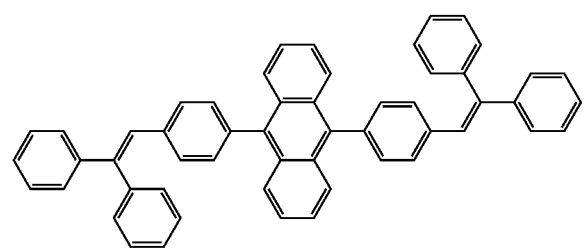

(3)

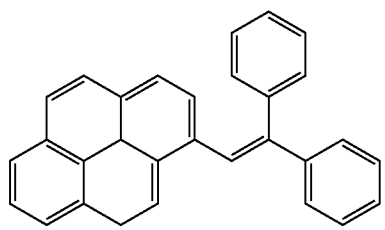

(4)

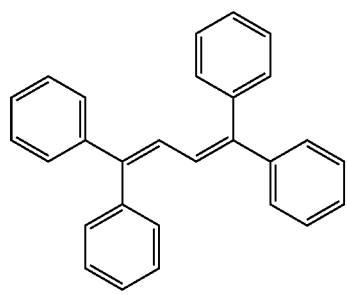

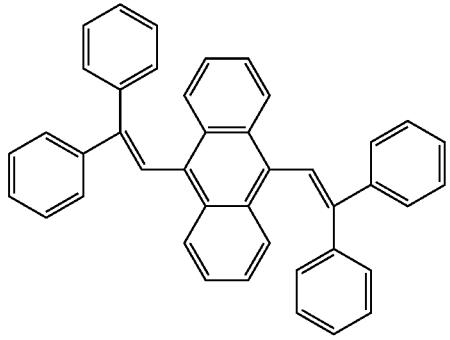

(5)

In each of the structures, the aromatic hydrocarbon containing at least one vinyl skeleton has hole mobility of $1 \times 10^{-6}$ cm$^2$/Vs or more.

A light emitting device having the above-described light emitting element and an electronic device having the light emitting device are also within the present invention. A light emitting device in the present specification denotes an image display device, a light emitting device, or a light source (including a lighting device). Further, the following are all included in a light emitting device: a module in which a connector, for example, an FPC (flexible printed circuit), a TAB (tape automated bonding) tape, or a TCP (tape carrier package) is attached to a light emitting device; a module provided with a printed wiring board at the end of the TAB tape or the TCP; and a module in which an IC (integrated circuit) is directly mounted to a light emitting element by a COG (chip on glass) method.

According to the present invention, by providing a buffer layer in part of a light emitting substance containing layer of a light emitting element, hole density in the light emitting substance containing layer can be enhanced; therefore, conductivity is increased and a drive voltage of the light emitting element can be reduced.

Further, aromatic hydrocarbon containing at least one vinyl skeleton and metal oxide are mixed in a composite material for a light emitting element for forming a buffer layer of the present invention; therefore, crystallization of aromatic hydrocarbon containing at least one vinyl skeleton which tends to be easily crystallized can be suppressed.

Furthermore, aromatic hydrocarbon containing at least one vinyl skeleton has steric hindrance because of its structure; therefore, a stable film which is in an amorphous state can be formed. In addition, the above-described material has an absorption peak on a shorter wavelength side than a visible region; thus, the material can be used without giving little influence on color purity of light emitted from a light emitting element.

Therefore, even in a case where a buffer layer is formed to be thick to protect a light emitting layer of a light emitting element, transparency is not degraded and increase of a drive voltage can be suppressed; therefore, deterioration and a short circuit of a light emitting element can be prevented and color purity can be improved by optical design.

These and other objects, features and advantages of the present invention will become more apparent upon reading of the following detailed description along with the accompanied drawings.

DETAILED DESCRIPTION OF THE INVENTION

Hereinafter, embodiment modes of the present invention will be explained in detail below with reference to the accompanied drawings or the like. However, the present invention can be implemented in various embodiments, and it is easily understood by those skilled in the art that embodiments and details can be modified in various ways without departing from the purpose and the scope of the present invention. Therefore, it should be noted that the present invention should not be interpreted as being limited to the description of the embodiment modes.

Embodiment Mode 1

Figure 1A:
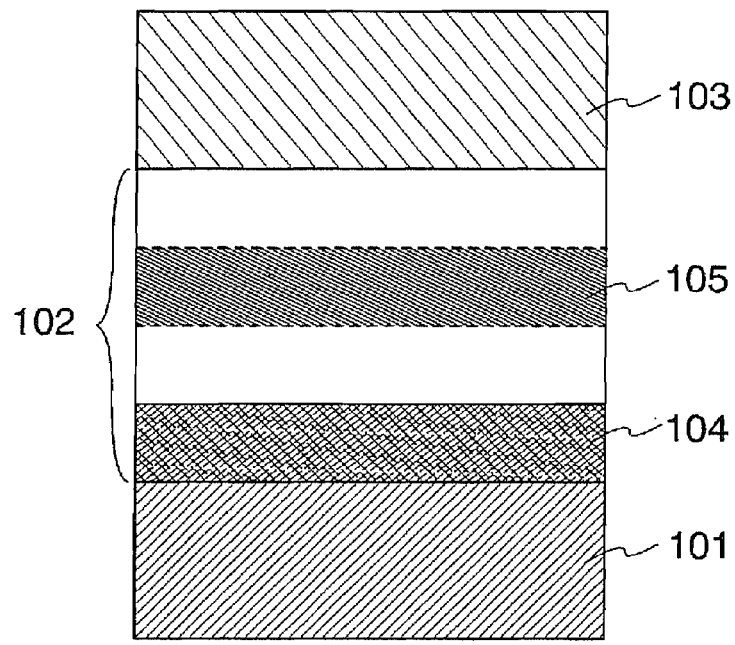
FIGS. 1A and 1B are views showing an element structure of a light emitting element of the present invention.
Figure 1B:
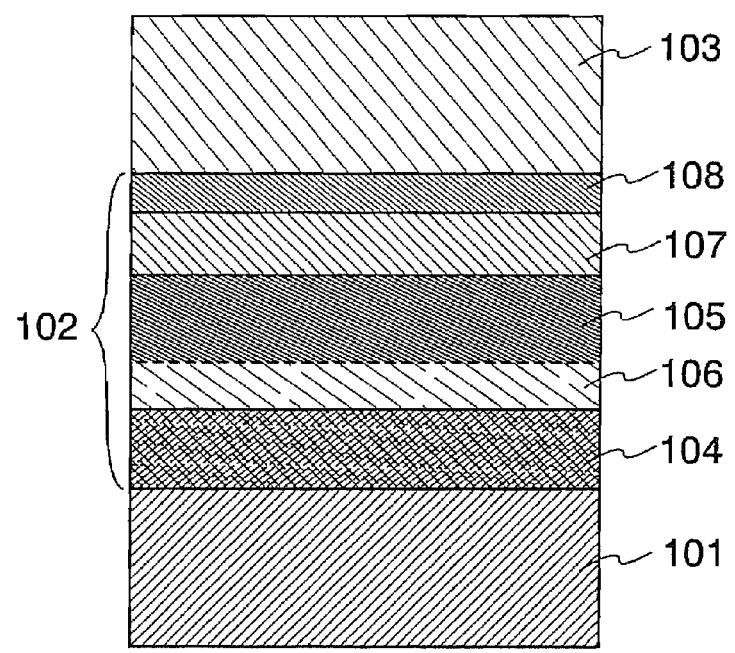

FIGS. 1A and 1B show an element structure of a light emitting element which will be explained in this embodiment mode. Basically, a structure is employed, in which a light emitting substance containing layer 102 is interposed between a pair of electrodes (a first electrode 101 and a second electrode 103) as shown in FIG. 1A. In this structure, the light emitting substance containing layer 102 has at least a light emitting layer 105 and a buffer layer 104 made of a composite material for a light emitting element of the present invention, and the buffer layer 104 is provided to be in contact with the first electrode 101. In Embodiment Mode 1, a case where the first electrode 101 serves as an anode and the second electrode 103 serves as a cathode will be explained. In this embodiment mode, a structure in which a hole transporting layer, an electron transporting layer, an electron injecting layer, a hole blocking layer, and the like are appropriately combined in addition to the above-described structure may also be employed.

In the present invention, the composite material for a light emitting element is formed by aromatic hydrocarbon containing at least one vinyl skeleton and metal oxide.

Aromatic hydrocarbon containing at least one vinyl skeleton is represented by, for example, any of the following structural formulas (1) to (5).

[Chemical formula 2]

The aromatic hydrocarbon containing at least one vinyl skeleton described above preferably has hole mobility of $1 \times 10^{-6}$ cm$^2$/Vs or more. It is to be noted that a TOF method (time-of-flight method) utilizing transient photocurrent can be employed to measure hole mobility here.

As the metal oxide described above, metal oxide which shows an electron-accepting property to the aromatic hydrocarbon containing at least one vinyl skeleton described above is preferable. As such metal oxide, for example, molybdenum oxide, vanadium oxide, ruthenium oxide, rhenium oxide, and the like are given. In addition to this, metal oxide such as titanium oxide, chromium oxide, zirconium oxide, hafnium oxide, tantalum oxide, tungsten oxide, or silver oxide can be used.

Metal oxide is preferably included in the buffer layer 104 so that a mass ratio is 0.5 to 2 or a molar ratio is 1 to 4 with respect to aromatic hydrocarbon containing at least one vinyl skeleton (=metal oxide/aromatic hydrocarbon). As described above, by mixing aromatic hydrocarbon containing at least one vinyl skeleton and metal oxide in the buffer layer 104, crystallization of aromatic hydrocarbon containing at least one vinyl skeleton which tends to be easily crystallized can be suppressed. Further, the buffer layer 104 including aromatic hydrocarbon containing at least one vinyl skeleton and metal oxide has little absorption in a visible wavelength region. In addition, absorption by an aromatic hydrocarbon containing at least one vinyl skeleton is shifted toward shorter wavelength in comparison to aromatic hydrocarbon without containing vinyl skeleton, because conjugation of an aromatic hydrocarbon containing at least one vinyl skeleton can not be extended. Therefore, A visible light emitted from the light emitting layer 105 can be prevented from absorption of the buffer layer 104.

In particular, among the metal oxide described above, molybdenum oxide is easily crystallized when a layer is formed using only molybdenum oxide; however, by mixing molybdenum oxide with aromatic hydrocarbon, crystallization can be suppressed in the same manner. By mixing aromatic hydrocarbon and metal oxide as described above, crystallization is disturbed by aromatic hydrocarbon and metal oxide mutually, and accordingly, a layer which is not easily crystallized can be formed.

The buffer layer 104 can be formed to have a thickness of 50 nm or more because of its high conductivity.

As an anode material used for the first electrode 101, metal, alloy, an electrically conductive compound, a mixture of these, or the like having a high work function (a work function of 4.0 eV or more) is preferably used. As a specific example of the anode material, gold (Au), platinum (Pt), titanium (Ti), nickel (Ni), tungsten (W), chromium (Cr), molybdenum (Mo), iron (Fe), cobalt (Co), copper (Cu), palladium (Pd), nitride of a metal material (for example, TiN), or the like can be used besides indium tin oxide (ITO), indium zinc oxide (IZO) in which indium oxide is mixed with 2 to 20[%] zinc oxide (ZnO). In a case of this embodiment mode, the buffer layer 104 is provided to be in contact with the first electrode; therefore, aluminum (Al) or magnesium (Mg) which is generally known as a material having a low work function can also be used. This is because an ohmic contact with respect to an electrode material having a wide-range work function can be formed by providing the buffer layer 104.

On the other hand, as a cathode material used for the second electrode 103, metal, alloy, an electrically conductive compound, a mixture of these, or the like having a low work function (a work function of 3.8 eV or lower) is preferably used. As a specific example of the cathode material, transition metal including rare-earth metal can be used besides an element belonging to Group 1 or Group 2 in the periodic law, namely alkali metal such as Li or Cs and alkaline earth metal such as Mg, Ca, or Sr, and alloy (Mg:Ag or Al:Li) or a compound (LiF, CsF, or $CaF_2$) containing these elements. However, in a case where a layer made of a material which increases an electron injecting property is provided in part of the light emitting substance containing layer 102 so as to be in contact with the second electrode 103, or provided as part of the second electrode 103, a material having a high work function such as indium tin oxide, indium tin oxide containing silicon oxide, indium oxide containing 2 to 20% zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride can also be used.

An anode and a cathode are made of the anode material and cathode material described above, respectively, by forming a thin film by a deposition method, a sputtering method, or the like. Each of the anode and cathode preferably has a thickness of 5 to 500 nm.

The light emitting element of the present invention has a structure in which light generated by recombination of carriers in the light emitting layer 105 is emitted outside from one or both of the first electrode (anode) 101 and the second electrode (cathode) 103. In other words, the first electrode 101 is made of a material having a light transmitting property in a case where light is made to be emitted from the first electrode 101 side, the second electrode 103 is made of a material having a light transmitting property in a case where light is made to be emitted from the second electrode 103 side, and both of the electrodes are made of a material having a light transmitting property in a case where light is made to be emitted from both sides of the electrodes.

In Embodiment Mode 1, the light emitting substance containing layer 102 which is formed between the pair of electrodes can be formed by combining a hole transporting layer 106, an electron transporting layer 107, and an electron injecting layer 108 in addition to the light emitting layer 105 and the buffer layer 104 as shown in FIG. 1B. Here, these layers will be explained hereinafter in detail.

The hole transporting layer 106 is a layer superior in a hole transporting property, and specifically, the hole transporting layer 106 is preferably made of a hole transporting substance which shows hole mobility of $1 \times 10^{-6}$ $cm^2/Vs$ or more or a bipolar substance. The hole transporting substance denotes a substance having higher hole mobility than electron mobility, and preferably, a substance having a value of a ratio of the hole mobility to the electron mobility (=hole mobility/electron mobility) of more than 100.

As the hole transporting substance, for example, an aromatic amine-based (namely a substance having a bond of benzene ring—nitrogen) compound is preferable. As a substance which is widely used, for example, 4,4'-bis[N-(3-methylphenyl)-N-phenylamino]biphenyl (hereinafter, referred to as TPD); 4,4'-bis[N-(1-naphtyl)-N-phenyl-amino]biphenyl (hereinafter, referred to as NPB) which is a derivative thereof; a star burst aromatic amine compound such as 4,4', 4"-tris(N-carbazolyl)triphenylamine (hereinafter, referred to as TCTA), 4,4',4"-tris(N,N-diphenyl-amino)-triphenylamine (hereinafter, referred to as TDATA), or 4,4',4"-tris[N-(3-methylphenyl)-N-phenyl-amino]triphenylamine (hereinafter, referred to as MTDATA) is given.

The bipolar substance denotes a substance which is described as follows: when mobility of an electron and mobility of a hole are compared with each other, a value of a ratio of mobility of one carrier to mobility of the other carrier is 100 or less, preferably 10 or less. As the bipolar substance, for example, 2,3-bis(4-diphenylaminophenyl)quinoxaline (abbreviation: TPAQn); 2,3-bis{4-[N-(1-naphthyl)-N-phenylamino]phenyl}-dibenzo[f,h]quinoxaline (abbreviation: NPADiBzQn); and the like are given. In particular, among bipolar substances, a substance having hole mobility and electron mobility of $1\times10^{-6}$ cm$^2$/Vs or more is preferably used.

The light emitting layer 105 includes at least one kind of light emitting substance, and the light emitting substance described here denotes a substance which has favorable luminous efficiency and can emit light of a desired wavelength. The light emitting layer may be a layer made of only a light emitting substance; however, a layer in which a light emitting substance is mixed to be dispersed in a layer made of a substance having larger energy gap (energy gap between the LUMO level and the HOMO level) than that of a light emitting substance may also be used. It is to be noted that light emission can be prevented from being quenched due to concentration by dispersing a light emitting substance which serves as a guest (also referred to as a guest substance) in a light emitting substance which serves as a host (also referred to as a host substance) in the light emitting layer.

As a specific light emitting substance, the following various fluorescent pigments are effective: tris(8-quinolinolato) aluminum (hereinafter, referred to as Alq$_3$); tris(4-methyl-8-quinolinolato)aluminum (hereinafter, referred to as Almq$_3$); bis(10-hydroxybenzo[h]-quinolinato)beryllium (hereinafter, referred to as BeBq$_2$); bis(2-methyl-8-quinolinolato)-(4-hydroxy-biphenylyl)-aluminum (hereinafter, referred to as BAlq); bis[2-(2-hydroxyphenyl)-benzoxazolato]zinc (hereinafter, referred to as Zn(BOX)$_2$); bis[2-(2-hydroxyphenyl)-benzothiazolato]zinc (hereinafter, referred to as Zn(BTZ)$_2$); 4-dicyanomethylene-2-isopropyl-6-[2-(1,1,7,7-tetramethyl-9-julolidyl)ethenyl]-4H-pyran (hereinafter, referred to as DCJTI); 4-dicyanomethylene-2-methyl-6-[2-(1,1,7,7-tetramethyl-9-julolidyl)ethenyl]-4H-pyran (hereinafter, referred to as DCJT); 4-dicyanomethylene-2-tert-butyl-6-[2-(1,1,7,7-tetramethyl-9-julolidyl)ethenyl]-4H-pyran (hereinafter, referred to as DCJTB); periflanthene; 2,5-dicyano-1,4-bis[2-(10-methoxy-1,1,7,7-tetramethyl-9-julolidyl)ethenyl]benzene; N,N'-dimethylquinacridone (hereinafter, referred to as DMQd); coumarin 6; coumarin 545T; 9,10-bis(2-naphthyl)-tert-butylanthracene (hereinafter, referred to as t-BuDNA); 9,9'-bianthryl; 9,10-diphenylanthracene (hereinafter, referred to as DPA); 9,10-bis(2-naphthyl)anthracene (hereinafter, referred to as DNA); bis(2-methyl-8-quinolinolato)-4-phenylphenolato-gallium (hereinafter, referred to as BGaq); bis(2-methyl-8-quinolinolato)-4-phenylphenolato-aluminum (hereinafter, referred to as BAlq); tris(2-phenylpyridine)iridium (hereinafter, referred to as Ir(ppy)$_3$); 2,3,7,8,12,13,17,18-octaethyl-21H,23H-porphyrin-platinum (hereinafter, referred to as PtOEP); bis[2-(3,5-bis(trifluoromethyl)phenyl)pyridinato-N,C$^{2'}$]iridium(III) picolinate (hereinafter, referred to as Ir(CF$_3$ ppy)$_2$(pic)); bis[2-(4,6-difluorophenyl)pyridinato-N,C$^{2'}$]iridium(III)acetylacetonate (hereinafter, referred to as FIr(acac)); bis[2-(4,6-difluorophenyl)pyridinato-N,C$^{2'}$]iridium(III)picolinate (hereinafter, referred to as FIr(pic)); and the like.

In a case where the light emitting layer is formed by combining a host substance and a guest substance, the light emitting layer may be formed by combining the light emitting substance described above and a host substance which will be described hereinafter.

As a specific host substance, the following can be used: tris(8-quinolinolato)aluminum (hereinafter, referred to as Alq$_3$); tris(4-methyl-8-quinolinolato)aluminum (hereinafter, referred to as Almq$_3$); bis(10-hydroxybenzo[h]-quinolinato) beryllium (hereinafter, referred to as BeBq$_2$); bis(2-methyl-8-quinolinolato)-(4-hydroxy-biphenylyl)-aluminum (hereinafter, referred to as BAlq); bis[2-(2-hydroxyphenyl)-benzoxazolato]zinc (hereinafter, referred to as Zn(BOX)$_2$); bis[2-(2-hydroxyphenyl)-benzothiazolato]zinc (hereinafter, referred to as Zn(BTZ)$_2$); 9,10-bis(2-naphthyl)-tert-butylanthracene (hereinafter, referred to as t-BuDNA); 9,10-bis(2-naphthyl)anthracene (hereinafter, referred to as DNA); bis(2-methyl-8-quinolinolato)-4-phenylphenolato-gallium (hereinafter, referred to as BGaq); 4,4'-di(N-carbazolyl)biphenyl (hereinafter, referred to as CBP); 4,4',4"-tri(N-carbazolyl)triphenylamine (hereinafter, referred to as TCTA); 2,2',2"-(1,3,5-benzenetriyl)-tris(1-phenyl-1H-benzimidazole) (hereinafter, referred to as TPBI); TPAQn; and the like.

The electron transporting layer 107 is a layer which is superior in an electron transporting property, and specifically, the electron transporting layer 107 is preferably made of an electron transporting substance which shows electron mobility of $1\times10^{-6}$ cm$^2$/Vs or more or a bipolar substance. The electron transporting substance denotes a substance having higher electron mobility than hole mobility, and preferably, a substance having a value of a ratio of the electron mobility to the hole mobility (=electron mobility/hole mobility) of more than 100.

As a specific electron transporting substance, a metal complex having a quinoline skeleton or a benzoquinoline skeleton such as Alq$_3$, Almq$_3$, or BeBq$_2$ which is described above; BAlq which is a mixed ligand complex; or the like is preferable. In addition, a metal complex having an oxazole-based or thiazole-based ligand such as Zn(BOX)$_2$ or Zn(BTZ)$_2$ can also be used. Further, an oxadiazole derivative such as 2-(4-biphenylyl)-5-(4-tert-butylphenyl)-1,3,4-oxadiazole (hereinafter, referred to as PBD) or 1,3-bis[5-(p-tert-buthylphenyl)-1,3,4-oxadiazol-2-yl]benzene (hereinafter, referred to as OXD-7); a triazole derivative such as 3-(4-tert-buthylphenyl)-4-phenyl-5-(4-biphenylyl)-1,2,4-triazole (hereinafter, referred to as TAZ) or 3-(4-tert-buthylphenyl)-4-(4-ethylphenyl)-5-(4-biphenylyl)-1,2,4-triazole (hereinafter, referred to as p-EtTAZ); a phenanthroline derivative such as bathophenanthroline (hereinafter, referred to as BPhen) or bathocuproin (hereinafter, referred to as BCP); and, in addition, 4,4-bis(5-methylbenzoxazolyl-2-yl)stilbene (hereinafter, referred to as BzOs); or the like can be used as well as a metal complex. It is to be noted that the materials described above can be used as the bipolar substance.

The electron injecting layer 108 is a layer having a function to assist electrons to be injected from the second electrode 103. In a case of a structure shown in FIG. 1B, the electron injecting layer 108 has a function to assist electrons to be injected from the second electrode 103 to the electron transporting layer 107. By providing the electron injecting layer 108, a difference between a work function of the second electrode 103 and electron affinity of the electron transporting layer 107 is relieved; thus, electrons are easily injected. The electron injecting layer 108 is preferably made of a substance of which electron affinity is higher than that of a substance for forming the electron transporting layer 107 and lower than that of a work function of a substance for forming the second electrode 103. Alternatively, the electron injecting layer 108 is preferably made of a substance having an effect of curving energy band by being provided as a thin film of about 1 nm to 2 nm between the electron transporting layer 107 and the second electrode 103.

As a specific example of a substance which can be used for forming the electron injecting layer 108, the following are given: an inorganic substance of alkali metal such as lithium (Li); alkaline earth metal such as magnesium (Mg); fluoride of alkali metal such as cesium fluoride (CsF); fluoride of alkaline earth metal such as calcium fluoride (CaF$_2$); oxide of alkali metal such as lithium oxide (Li$_2$O), sodium oxide (Na$_2$O), or potassium oxide (K$_2$O); or oxide of alkaline earth metal such as calcium oxide (CaO) or magnesium oxide (MgO). These substances are preferable because there is an effect of curving the energy band by being provided as a thin film.

In addition to the inorganic substance, an organic substance which can be used for forming the electron transporting layer 107, such as bathophenanthroline (abbreviation: BPhen); bathocuproin (abbreviation: BCP); 3-(4-tert-buthylphenyl)-4-(4-ethylphenyl)-5-(4-biphenylyl)-1,2,4-triazole (abbreviation: p-EtTAZ); or 3-(4-tert-buthylphenyl)-4-phenyl-5-(4-biphenylyl)-1,2,4-triazole (abbreviation: TAZ), can also be used as a substance for Miming the electron injecting layer 108 by selecting a substance of which electron affinity is higher than that of a substance which is used for forming the electron transporting layer 107 among these substances. In other words, the electron injecting layer 108 may be formed by selecting a substance so that electron affinity in the electron injecting layer 108 is higher than that in the electron transporting layer 107. It is to be noted that the second electrode 103 is preferably made of a substance having a low work function such as aluminum in a case of providing the electron injecting layer 108.

In addition, an electron generating layer can also be provided instead of the electron injecting layer 108. The electron generating layer is a layer for generating electrons, which can be formed by mixing at least one substance of an electron transporting substance and a bipolar substance with a substance (donor) which shows an electron-donating property to these substances. It is to be noted that a substance having electron mobility of $1 \times 10^{-6}$ cm$^2$/Vs or more is preferable as the electron transporting substance and the bipolar substance.

As for the electron transporting substance and the bipolar substance, the above substances can be used for each. In addition, as for the substance which shows an electron-donating property, a substance of alkali metal or alkaline earth metal, specifically, lithium (Li), calcium (Ca), sodium (Na), potassium (K), magnesium (Mg), or the like can be used. Moreover, a substance such as alkali metal oxide, alkaline earth metal oxide, alkali metal nitride, or alkaline earth metal nitride, specifically, lithium oxide (Li$_2$O), calcium oxide (CaO), sodium oxide (Na$_2$O), potassium oxide (K$_2$O), magnesium oxide (MgO), lithium fluoride (LiF), cesium fluoride (CsF), calcium fluoride (CaF2), or the like can also be used as the substance which shows an electron-donating property.

In addition, although not shown in FIG. 1B, a hole blocking layer can be provided between the light emitting layer 105 and the electron transporting layer 107. By providing the hole blocking layer, holes can be prevented from flowing in the second electrode 103 direction without being recombined with electrons in the light emitting layer 105; thus, recombination efficiency of carriers can be increased. Moreover, excitation energy generated in the light emitting layer 105 can be prevented from moving to other layers such as the electron transporting layer 107.

For the hole blocking layer, a substance is particularly selected, of which ionization potential and excitation energy are higher than those of a substance which is used for forming the light emitting layer 105, among substances which can be used for forming the electron transporting layer 107, such as BAlq, OXD-7, TAZ, or BPhen. In other words, the hole blocking layer may be formed by selecting a substance so that ionization potential in the hole blocking layer is higher than that in the electron transporting layer 107. In the same manner, a layer for blocking electrons from flowing in the second electrode 103 direction without being recombined with holes in the light emitting layer 105 may also be provided between the light emitting layer 105 and the hole transporting layer 106.

Accordingly, a light emitting element is obtained, which has the buffer layer 104 made of the composite material for a light emitting element of the present invention in part of the light emitting substance containing layer 102 of a light emitting element, where the buffer layer 104 is provided to be in contact with the first electrode 101 which is an anode.

In Embodiment Mode 1, the composite material for a light emitting element for forming the buffer layer 104 has a hole transporting property, can suppress crystallization of aromatic hydrocarbon containing at least one vinyl skeleton which tends to be easily crystallized because aromatic hydrocarbon containing at least one vinyl skeleton and metal oxide are mixed, and further, has a property of high transparency and high conductivity.

Thus, even if the buffer layer 104 is formed to be thick, transparency is not damaged, and increase of a drive voltage can be suppressed; therefore, a thickness can be freely set to prevent a short circuit of a light emitting element and to improve color purity by optical design. It is effective that the thickness of the buffer layer 104 is set to be 60 nm or more to prevent a short circuit.

Embodiment Mode 2

In Embodiment Mode 2, a structure which is different from the light emitting element explained in Embodiment Mode 1, specifically, a structure in which a buffer layer is provided to be in contact with a second electrode (cathode) will be explained.

Figure 2A:
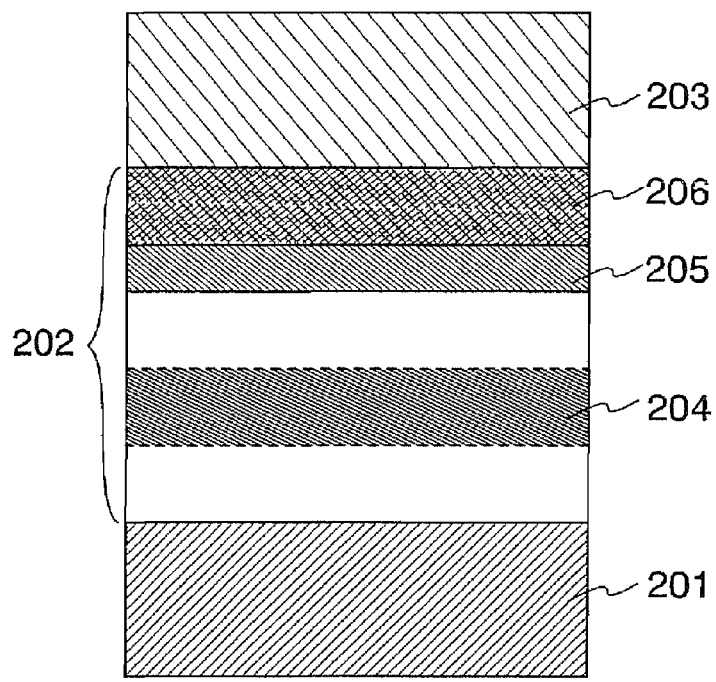
FIGS. 2A and 2B are views showing an element structure of a light emitting element of the present invention.
Figure 2B:
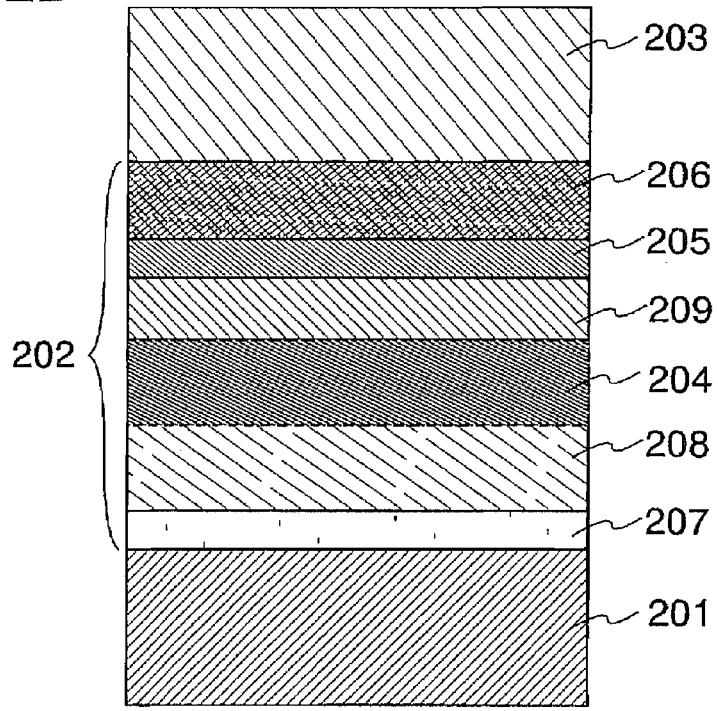

FIGS. 2A and 2B show an element structure of a light emitting element which will be explained in Embodiment Mode 2. Basically, a structure is employed, in which a light emitting substance containing layer 202 is interposed between a pair of electrodes (a first electrode 201 and a second electrode 203) as shown in FIG. 2A. In this structure, the light emitting substance containing layer 202 has at least a light emitting layer 204, an electron generating layer 205, and a buffer layer 206 made of a composite material for a light emitting element of the present invention, and the buffer layer 206 is provided between the second electrode 203 and the electron generating layer 205 to be in contact with each of them. In Embodiment Mode 2, a case where the first electrode 201 serves as an anode and the second electrode 203 serves as a cathode will be explained. In Embodiment Mode 2, a structure in which a hole injecting layer, a hole transporting layer, an electron transporting layer, a hole blocking layer, and the like are appropriately combined in addition to the above structure may also be employed.

The composite material for a light emitting element for forming the buffer layer 206 includes aromatic hydrocarbon containing at least one vinyl skeleton shown in Embodiment Mode 1 and metal oxide shown in Embodiment Mode 1.

Also in Embodiment Mode 2, metal oxide is preferably included in the buffer layer 206 so that a mass ratio is 0.5 to 2 or a molar ratio is 1 to 4 with respect to aromatic hydrocarbon containing at least one vinyl skeleton (=metal oxide/aromatic hydrocarbon). The buffer layer 206 can be formed to have a thickness of 50 nm or more because of its high conductivity.

The electron generating layer 205 is a layer for generating electrons, which can be formed by mixing at least one substance of an electron transporting substance and a bipolar substance with a substance (donor) which shows an electron-donating property to these substances. It is to be noted that a substance having electron mobility of $1\times10^{-6}$ cm$^2$/Vs or more is preferable as the electron transporting substance and the bipolar substance.

As the electron transporting substance, the bipolar substance, and the substance (donor) which shows an electron-donating property, which are used for forming the electron generating layer 205, the substance given in Embodiment Mode 1 can be used for each.

As an anode material used for the first electrode 201, metal, alloy, an electrically conductive compound, a mixture of these, or the like having a high work function (a work function of 4.0 eV or more) can be used. As a specific example of the anode material, gold (Au), platinum (Pt), titanium (Ti), nickel (Ni), tungsten (W), chromium (Cr), molybdenum (Mo), iron (Fe), cobalt (Co), copper (Cu), palladium (Pd), nitride of a metal material (for example, TiN), or the like can be used besides indium tin oxide (ITO), indium zinc oxide (IZO) in which indium oxide is mixed with 2 to 20[%] zinc oxide (ZnO).

On the other hand, as a cathode material used for the second electrode 203, metal, alloy, an electrically conductive compound, a mixture of these, or the like can be used. As a specific example of the cathode material, a material having a high work function such as indium tin oxide, indium tin oxide containing silicon oxide, indium oxide containing 2 to 20% zinc oxide, gold (Au), platinum (Pt), nickel (Ni), tungsten (W), chromium (Cr), molybdenum (Mo), iron (Fe), cobalt (Co), copper (Cu), palladium (Pd), aluminum (Al), silver (Ag), or tantalum nitride can also be used.

An anode and a cathode are made of the anode material and cathode material described above, respectively, by forming a thin film by a deposition method, a sputtering method, or the like. Each of the anode and cathode preferably has a thickness of 5 to 500 nm.

The light emitting element of the present invention has a structure in which light generated by recombination of carriers in the light emitting substance containing layer 202 is emitted outside from one or both of the first electrode (anode) 201 and the second electrode (cathode) 203. In other words, the first electrode 201 is made of a material having a light transmitting property in a case where light is made to be emitted from the first electrode 201 side, the second electrode 203 is made of a material having a light transmitting property in a case where light is made to be emitted from the second electrode 203 side, and both of the electrodes are made of a material having a light transmitting property in a case where light is made to be emitted from both sides of the electrodes.

In Embodiment Mode 2, the light emitting substance containing layer 202 which is formed between the pair of electrodes can be formed by combining a hole injecting layer 207, a hole transporting layer 208, and an electron transporting layer 209 in addition to the light emitting layer 204, the electron generating layer 205, and the buffer layer 206 as shown in FIG. 2B. Here, these layers will be explained hereinafter in detail.

The hole injecting layer 207 is, in Embodiment Mode 2, a layer having a function to assist holes to be injected from the first electrode 201 to the hole transporting layer 208. By providing the hole injecting layer 207, a difference between a work function of the first electrode 201 and ionization potential of the hole transporting layer 208 is relieved; thus, holes are easily injected. The hole injecting layer 207 is preferably made of a substance of which ionization potential is lower than that of a substance for fowling the hole transporting layer 208 and higher than that of a work function of a substance for forming the first electrode 201.

As a specific example of a substance which can be used for forming the hole injecting layer 207, a low molecular compound such as phthalocyanine (abbreviation: H$_2$Pc) or copper phthalocyanine (abbreviation: CuPc), a high molecular compound such as poly(ethylenedioxythiophene)/poly(styrene sulfonate) water solution (abbreviation: PEDOT/PSS), and the like are given.

The hole transporting layer 208 is a layer superior in a hole transporting property, and in Embodiment Mode 2, has a function to transport holes injected from the hole injecting layer 207 to the light emitting layer 204. It is to be noted that the hole transporting layer 208 is preferably made of a hole transporting substance which shows hole mobility of $1\times10^{-6}$ cm$^2$/Vs or more or a bipolar substance. As the hole transporting substance and the bipolar substance herein described, the substance given in Embodiment Mode 1 can be used for each.

The light emitting layer 204 includes at least one kind of light emitting substance, and a light emitting substance described here denotes a substance which has favorable luminous efficiency and can emit light of a desired wavelength. The light emitting layer 204 may be a layer made of only a light emitting substance; however, a layer in which a light emitting substance is mixed to be dispersed in a layer made of a substance having larger energy gap (energy gap between the LUMO level and the HOMO level) than that of a light emitting substance may also be used. It is to be noted that light emission can be prevented from being quenched due to concentration by dispersing a light emitting substance which serves as a guest (also referred to as a guest substance) in a light emitting substance which serves as a host (also referred to as a host substance) in the light emitting layer. As a specific light emitting substance which can be used for the light emitting layer 204, the substance given in Embodiment Mode 1 (including a guest substance) can be used.

The electron transporting layer 209 is a layer which is superior in an electron transporting property, and in Embodiment Mode 2, has a function to transport electrons injected from the electron generating layer 205 to the light emitting layer 204. As a substance for forming the electron transporting layer 209, specifically, an electron transporting substance which shows electron mobility of $1\times10^{-6}$ cm$^2$/Vs or more or a bipolar substance is preferably used. As the electron transporting substance and the bipolar substance herein described, the substance given in Embodiment Mode 1 can be used for each.

In addition, although not shown in FIG. 2B, a hole blocking layer can be provided between the light emitting layer 204 and the electron transporting layer 209. By providing the hole blocking layer, holes can be prevented from flowing in the second electrode 203 direction without being recombined with electrons in the light emitting layer 204; thus, recombination efficiency of carriers can be increased. As the substance for forming the hole blocking layer, the substance given in Embodiment Mode 1 can be used.

Accordingly, a light emitting element is obtained, which has the buffer layer 206 made of the composite material for a light emitting element of the present invention in part of the light emitting substance containing layer 202 of a light emitting element, where the buffer layer 206 is provided between the second electrode 203 which is a cathode and the electron generating layer 205 to be in contact with each of them.

In the light emitting element of Embodiment Mode 2, the composite material for forming the buffer layer 206 has a hole transporting property and can suppress crystallization of aromatic hydrocarbon containing at least one vinyl skeleton because aromatic hydrocarbon containing at least one vinyl skeleton and metal oxide are mixed. Further, the composite material for forming the buffer layer 206 has a property of high transparency and high conductivity.

Thus, even if the buffer layer 206 is formed to be thick, transparency is not damaged, and increase of a drive voltage can be suppressed; therefore, a thickness can be freely set to prevent a short circuit of a light emitting element and to improve color purity by optical design. It is effective that the thickness of the buffer layer 206 is set to be 60 nm or more to prevent a short circuit.

In a case or the like where the second electrode 203 is formed by a sputtering method after fanning the light emitting substance containing layer 202, the buffer layer 206 serves as a barrier film, which can reduce damage to the light emitting layer 204 and the like.

Figure 3:
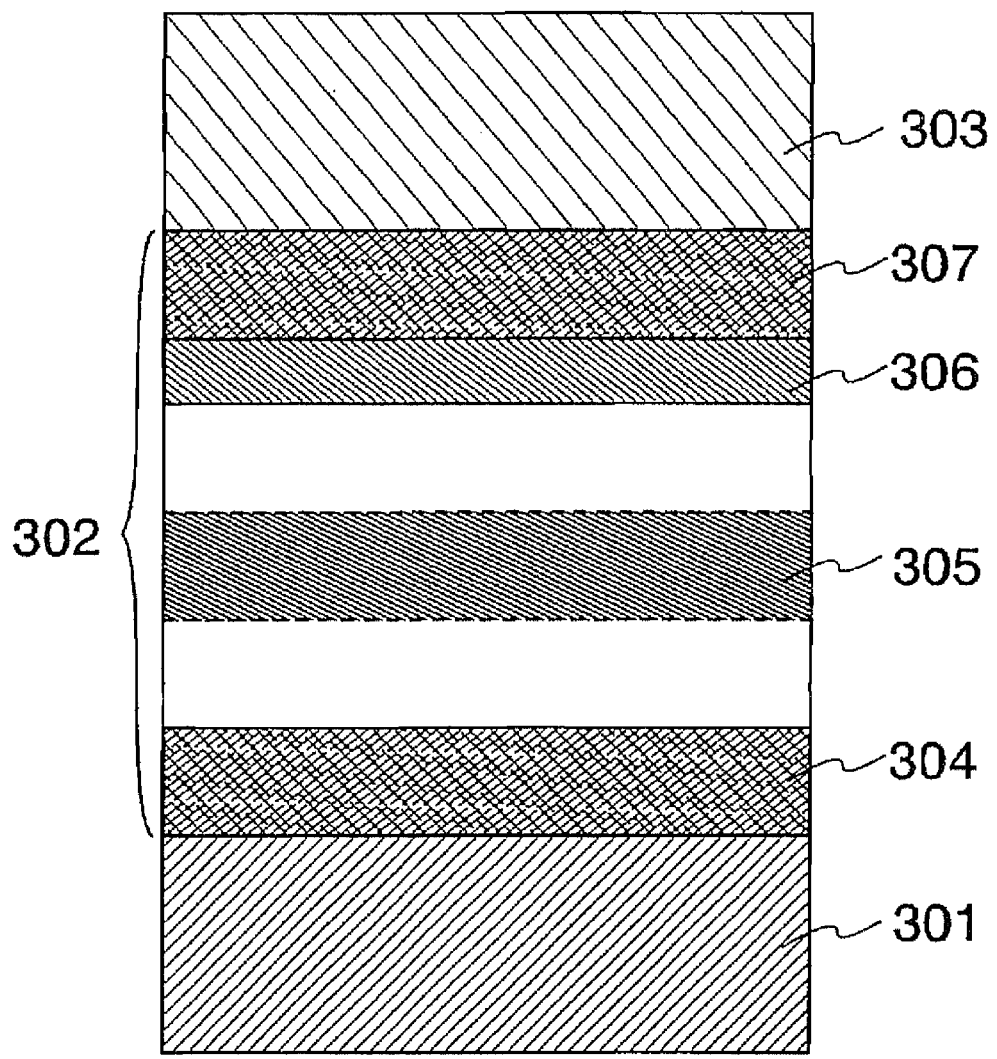
FIG. 3 is a view showing an element structure of a light emitting element of the present invention.

Further, in the present invention, a structure shown in FIG. 3, in which a buffer layer made of a composite material for a light emitting element of the present invention is provided to be in contact with both electrodes (anode and cathode) of a light emitting element, can be formed by combining the structure shown in Embodiment Mode 2 and the structure shown in Embodiment Mode 1.

In FIG. 3, a light emitting substance containing layer 302 is interposed between a pair of electrodes (a first electrode 301 and a second electrode 303), and the light emitting substance containing layer 302 has at least a light emitting layer 305, a buffer layer (a first buffer layer 304 and a second buffer layer 307) made of a composite material for a light emitting element of the present invention, and an electron generating layer 306.

The first buffer layer 304 is provided to be in contact with the first electrode 301, and the second buffer layer 307 is provided between the second electrode 303 and the electron generating layer 306 to be in contact with each of them. Also in this case, the first electrode 301 serves as an anode, and the second electrode 303 serves as a cathode. Further, also in a case of this structure, a structure can be employed, in which a hole transporting layer, an electron transporting layer, a hole blocking layer, and the like are combined in addition to the structure shown in FIG. 3. As a substance for forming the hole transporting layer, the electron transporting layer, and the hole blocking layer, the substance given in Embodiment Mode 1 can be used.

Also in the light emitting element shown in FIG. 3, the composite material for a light emitting element for forming the buffer layer (the first buffer layer 304 and the second buffer layer 307) has a hole transporting property, is not easily crystallized, and has a property of high transparency and high conductivity. Thus, even if the first buffer layer 304 and second buffer layer 307 are formed to be thick, transparency is not damaged and increase of a drive voltage can be suppressed; therefore, thickness of the first buffer layer 304 and the second buffer layer 307 can be freely set to prevent a short circuit of a light emitting element and to improve color purity by optical design.

In a case or the like where the second electrode 303 is formed by a sputtering method after forming the light emitting substance containing layer 302, the second buffer layer 307 serves as a barrier film, which can reduce damage to the light emitting layer 305 and the like. Further, in a case where the first buffer layer 304 and the second buffer layer 307 are formed by the same substance, both sides of the light emitting substance containing layer 302 is formed by the same substance; therefore, an effect that stress distortion is suppressed can be expected.

Embodiment Mode 3

In Embodiment Mode 3, a light emitting element which has a structure different from that in Embodiment Modes 1 and 2, specifically, a light emitting element having a structure in a case of providing at least one buffer layer formed without being in contact with an anode and a cathode, which is a so-called multiphoton light emitting element, will be explained.

Figure 4A:
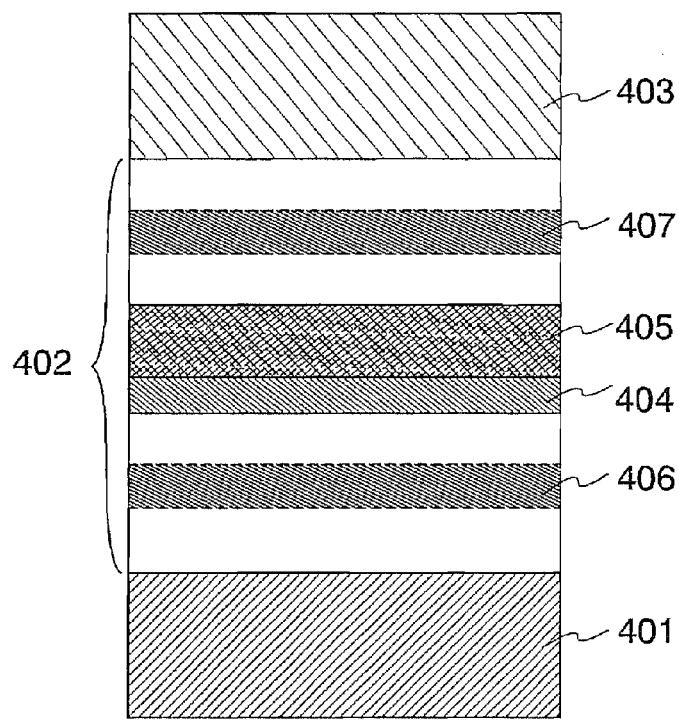
FIGS. 4A and 4B are views showing an element structure of a light emitting element of the present invention.
Figure 4B:
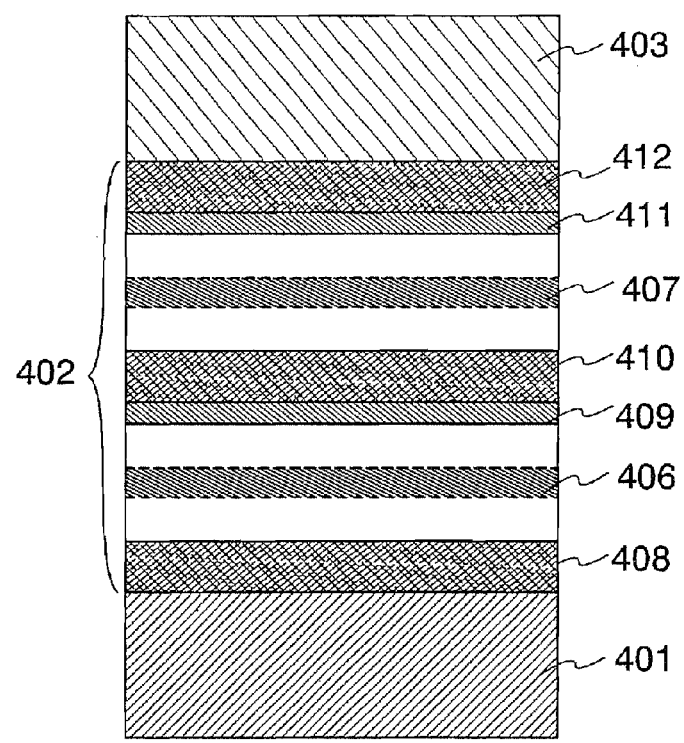

FIGS. 4A and 4B show an element structure of a light emitting element which will be explained in Embodiment Mode 3. Basically, a structure is employed, in which a light emitting substance containing layer 402 is interposed between a pair of electrodes (a first electrode 401 and a second electrode 403) as shown in FIG. 4A. In the structure, the light emitting substance containing layer 402 has at least a first light emitting layer 406, a second light emitting layer 407, an electron generating layer 404, and a buffer layer 405 made of a composite material for a light emitting element of the present invention, and at least the buffer layer 405 and the electron generating layer 404 which is formed to be in contact therewith are provided without being in contact with the first electrode 401 and the second electrode 403. In Embodiment Mode 3, a case where the first electrode 401 serves as an anode and the second electrode 403 serves as a cathode will be explained. Further, in Embodiment Mode 3, a structure may be employed, in which a hole injecting layer, a hole transporting layer, an electron transporting layer, a hole blocking layer, an electron injecting layer, and the like are appropriately combined in addition to the above structure.

The composite material for a light emitting element for forming the buffer layer 405 includes aromatic hydrocarbon containing at least one vinyl skeleton shown in Embodiment Mode 1 and metal oxide shown in Embodiment Mode 1.

Also in Embodiment Mode 3, metal oxide is preferably included in the buffer layer 405 so that a mass ratio is 0.5 to 2 or a molar ratio is 1 to 4 with respect to aromatic hydrocarbon containing at least one vinyl skeleton (=metal oxide/aromatic hydrocarbon). The buffer layer 405 can be formed to have a thickness of 50 nm or more because of its high conductivity.

In Embodiment Mode 3, the electron generating layer 404 is formed to be in contact with the buffer layer 405, and the electron generating layer 404 is formed closer to the first electrode 401 side, which is an anode, than the buffer layer 405. The electron generating layer 404 is a layer for generating electrons, which can be formed by mixing at least one substance of an electron transporting substance and a bipolar substance with a substance which shows an electron-donating property to these substances. Here, it is preferable to particularly use a substance having electron mobility of $1 \times 10^{-6}$ cm$^2$/Vs or more among the electron transporting substance and the bipolar substance.

As for the electron transporting substance, the bipolar substance, and the substance which shows an electron-donating property, which are used for forming the electron generating layer 404, the substance given in Embodiment Mode 1 can be used for each.

As an anode material for the first electrode 401, metal, alloy, an electrically conductive compound, a mixture of these, or the like having a high work function (a work function of 4.0 eV or more) can be used. As a specific example of the anode material, gold (Au), platinum (Pt), titanium (Ti), nickel (Ni), tungsten (W), chromium (Cr), molybdenum (Mo), iron (Fe), cobalt (Co), copper (Cu), palladium (Pd), nitride of a metal material (for example, TiN), or the like can be used besides indium tin oxide (ITO), indium zinc oxide (IZO) in which indium oxide is mixed with 2 to 20[%] zinc oxide (ZnO). In a case of providing a buffer layer to be in contact with the first electrode 401 as shown in Embodiment Mode 1, aluminum (Al) or magnesium (Mg) which is generally known as a material having a low work function can also be used. This is because an ohmic contact with respect to an electrode material having a wide-range work function can be formed by providing the buffer layer 405.

On the other hand, as a cathode material for the second electrode 403, metal, alloy, an electrically conductive compound, a mixture of these, or the like having a low work function (a work function of 3.8 eV or lower) can be used. As a specific example of the cathode material, transition metal containing rare-earth metal can be used besides an element belonging to Group 1 or Group 2 in the periodic law, namely alkali metal such as Li or Cs, alkaline earth metal such as Mg, Ca, or Sr, and alloy containing these (Mg:Ag or Al:Li) or a compound (LiF, CsF, or CaF$_2$). However, in addition to the above structure, in a case where a buffer layer is provided to be in contact with the second electrode 403 and an electron generating layer is provided to be in contact with the buffer layer, a material or the like having a high work function such as indium tin oxide, indium tin oxide containing silicon oxide, indium oxide containing 2 to 20% zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride can be used.

An anode and a cathode are made of the anode material and cathode material described above, respectively, by forming a thin film by a deposition method, a sputtering method, or the like. Each of the anode and cathode preferably has a thickness of 5 to 500 nm.

The light emitting element of the present invention has a structure in which light generated by recombination of carriers in the light emitting substance containing layer 402 is emitted outside from one or both of the first electrode (anode) 401 and the second electrode (cathode) 403. In other words, the first electrode 401 is made of a material having a light transmitting property in a case where light is made to be emitted from the first electrode 401 side, the second electrode 403 is made of a material having a light transmitting property in a case where light is made to be emitted from the second electrode 403 side, and both of the electrodes are made of a material having a light transmitting property in a case where light is made to be emitted from both sides of the electrodes.

In Embodiment Mode 3, the electron generating layer 404 and the buffer layer 405 are formed without being in contact with the first electrode 401 and the second electrode 403, and at least the first light emitting layer 406 is provided between the first electrode 401 and the electron generating layer 404. Further, at least the second light emitting layer 407 is provided between the buffer layer 405 and the second electrode 403. As the substance used for forming the first light emitting layer 406 and the second light emitting layer 407, the substance mentioned as a substance for forming the light emitting layer in Embodiment Mode 1 can be used.

In Embodiment Mode 3, a buffer layer can be provided in addition to the above structure so as to be in contact with the first electrode 401 and the second electrode 403, respectively. In this case, a first buffer layer 408 is provided to be in contact with the first electrode 401 and a third buffer layer 412 is provided to be in contact with the second electrode 403, as shown in FIG. 4B. Further, a second electron generating layer 411 is provided to be in contact with the third buffer layer 412, and a first electron generating layer 409 and a second buffer layer 410 shown in FIG. 4B have the same function as the electron generating layer 404 and the buffer layer 405 shown in FIG. 4A.

The first buffer layer 408, the second buffer layer 410, and the third buffer layer 412 shown in FIG. 4B can be made of the composite material for a light emitting element including aromatic hydrocarbon containing at least one vinyl skeleton and metal oxide shown in Embodiment Mode 1. The first electron generating layer 409 and the second generating layer 411 shown in FIG. 4B can be formed by mixing at least one substance of the electron transporting substance and the bipolar substance, and a substance which shows an electron-donating property to these substances shown in Embodiment Mode 1.

In FIG. 4B (although not shown here), a hole transporting layer, an electron transporting layer, a hole blocking layer, and the like can be formed by being appropriately combined in a region between the first buffer layer 408 and the first electron generating layer 409, which includes at least the first light emitting layer 406, and a region between the second buffer layer 410 and the second electron generating layer 411, which includes at least the second light emitting layer 407. It is to be noted that each of the hole transporting layer, the electron transporting layer, and the hole blocking layer can be made of the substance mentioned in Embodiment Mode 1, respectively.

Accordingly, a light emitting element having the buffer layer 405 made of the composite material for a light emitting element of the present invention in part of the light emitting substance containing layer 402 of the light emitting element, in which at least the buffer layer 405 and the electron generating layer 404 formed to be in contact therewith are formed without being in contact with the first electrode 401 and the second electrode 403, can be obtained.

In the light emitting element in Embodiment Mode 3, the composite material for a light emitting element for forming the buffer layer 405 (in a case of being shown in FIG. 4B, the first buffer layer 408, the second buffer layer 410, and the third buffer layer 412) has a hole transporting property, and crystallization of aromatic hydrocarbon containing at least one vinyl skeleton can be suppressed because aromatic hydrocarbon containing at least one vinyl skeleton and metal oxide are mixed. Further, the composite material for a light emitting element has a property of high transparency and high conductivity.

Thus, even if the buffer layer 405 (in a case of being shown in FIG. 4B, the first buffer layer 408, the second buffer layer 410, and the third buffer layer 412) is fanned to be thick, transparency is not damaged and increase of a drive voltage can be suppressed; therefore, a thickness can be freely set to prevent a short circuit of a light emitting element and to improve color purity by optical design. It is effective that the thickness of the buffer layer 405 (in a case of being shown in FIG. 4B, the first buffer layer 408, the second buffer layer 410, and the third buffer layer 412) is set to be 60 nm or more to prevent a short circuit.

As shown in FIG. 4B, in a case or the like where the second electrode 403 is formed by a sputtering method after forming the light emitting substance containing layer 402, the third buffer layer 412 serves as a barrier film, which can reduce damage to the second light emitting layer 407 and the like. Further, in a case where the first buffer layer 408 and the second buffer layer 412 are formed by the same substance, both sides of the light emitting substance containing layer 402 is formed by the same substance; therefore, an effect that stress distortion is suppressed can be expected.

Embodiment Mode 4

Figure 5A:
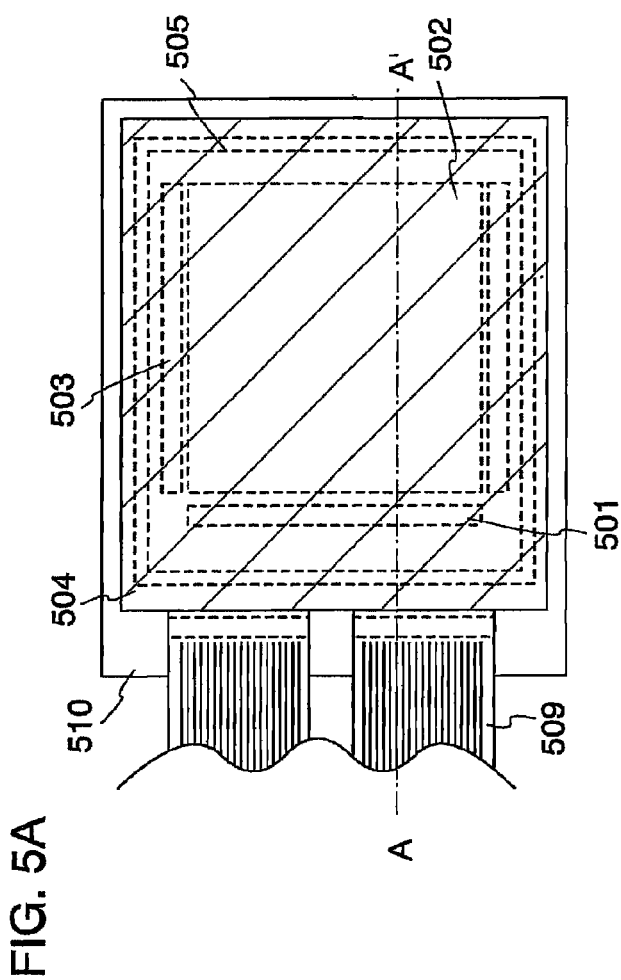
FIGS. 5A and 5B are views showing a light emitting device of the present invention.
Figure 5B:
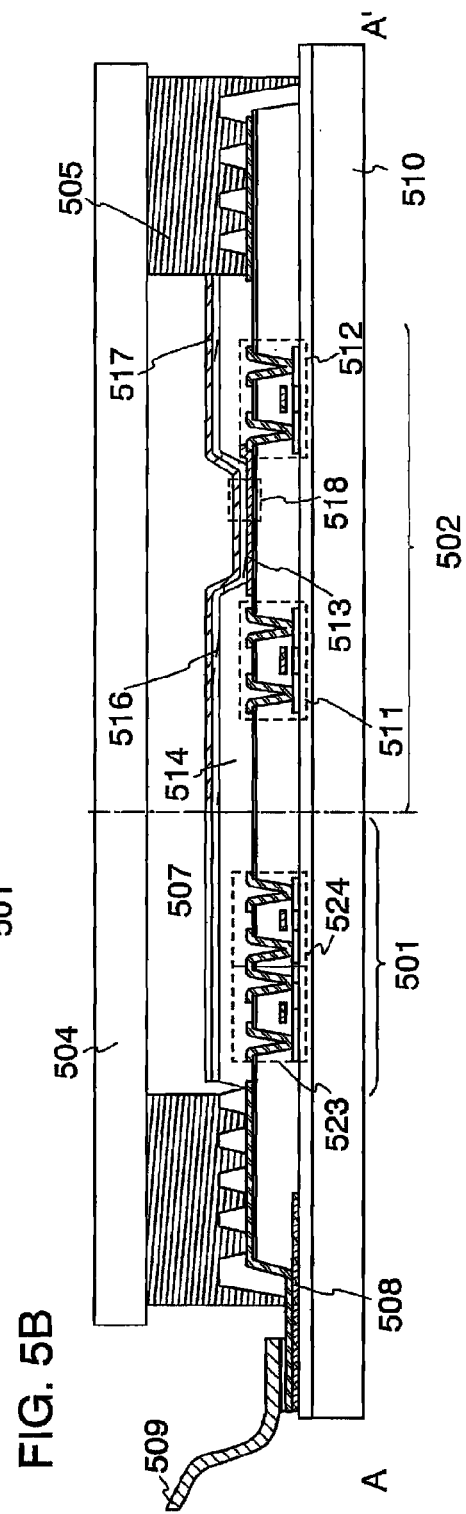

In Embodiment Mode 4, a light emitting device having a light emitting element formed by the present invention in a pixel portion will be explained with reference to FIGS. 5A and 5B. Although a light emitting device having an active matrix light emitting element formed by the present invention is shown in FIGS. 5A and 5B, the present invention can be applied to a light emitting device having a passive matrix light emitting element. The light emitting device in the present invention includes a control means for driving a light emitting element, and the like, in addition to the light emitting element of the present invention. FIG. 5A is a top view showing a light emitting device and FIG. 5B is a cross-sectional view taken along A-A'. Reference numeral 501 indicated by a dotted line denotes a driver circuit portion (a source side driver circuit); 502, a pixel portion; 503, a driver circuit portion (a gate side driver circuit); 504, a sealing substrate; 505, a sealing member, and 507, a space surrounded by the sealing member 505.

Reference numeral 508 denotes a wiring for transmitting a signal inputted to the source side driver circuit 501 and the gate side driver circuit 503, and the wiring 508 receives a video signal, a clock signal, a start signal, a reset signal, and the like from an FPC (flexible printed circuit) 509 which is to be an external input terminal. Although only the FPC is shown here, a printed wiring board (PWB) may be attached to the FPC. The light emitting device in the present specification includes not only the light emitting device itself but also includes a state where the FPC or PWB is attached to the light emitting device.

Next, a cross-sectional structure will be explained with reference to FIG. 5B. Although a driver circuit portion and a pixel portion are formed on an element substrate 510, a source side driver circuit 501 which is a driver circuit portion and a pixel portion 502 are shown here.

As the source side driver circuit 501, a CMOS circuit in which an n-channel TFT 523 and a p-channel TFT 524 are combined is formed. A TFT for forming a driver circuit may be formed by a CMOS circuit, a PMOS circuit, or an NMOS circuit. In this embodiment mode, a driver-integrated type in which a driver circuit is formed on a substrate is shown; however, it is not necessary to have the structure, and the driver circuit can be formed not on the substrate but outside.

The pixel portion 502 is formed by a plurality of pixels including a switching TFT 511, a current control TFT 512, and a first electrode 513 which is electrically connected to a drain thereof. An insulator 514 is formed so as to cover an edge portion of the first electrode 513. Here, the insulator 514 is formed by a positive type photosensitive acrylic resin film.

A light emitting substance containing layer 516 and a second electrode 517 are formed on the first electrode 513, respectively. Here, as a material used for the first electrode 513 serving as an anode, a material having a high work function is desirable. For example, a stacked film such as a two-layer structure of titanium nitride and a film containing aluminum as its main component or a three-layer structure of a titanium nitride film, a film containing aluminum as its main component, and a titanium nitride film can be used besides a single-layer film such as an ITO (indium tin oxide) film, an indium zinc oxide (IZO) film, a titanium nitride film, a chromium film, a tungsten film, a Zn film, or a Pt film. By employing the stacked structure, a resistance as the wiring can be low, and an ohmic contact can be favorably formed, and further, the stacked structure can be made to serve as an anode.

The light emitting substance containing layer 516 is formed by a deposition method using a deposition mask or an ink jet method. The light emitting substance containing layer 516 includes a buffer layer made of a composite material for a light emitting element of the present invention. Besides, a light emitting layer, an electron generating layer, a hole transporting layer, an electron transporting layer, a hole blocking layer, a hole injecting layer, an electron injecting layer, and the like are included. In a case of forming these layers, a low molecular-based material, an intermediate molecular material (including oligomer and dendrimer), or a high molecular-based material can be used. In a case of forming the light emitting substance containing layer, a single layer or a stack of an organic compound is generally used; however, the present invention also includes a structure in which an inorganic compound is used in part of a film made of an organic compound.

In the present invention, a buffer layer is provided to be in contact with one of the electrodes (one of an anode and a cathode) of the light emitting element, or provided to be in contact with both of the electrodes, or alternatively, provided without being in contact with both of the electrodes. However, in a case where the buffer layer is formed to be in contact with the cathode, it is necessary to provide the electron generating layer to be in contact with the surface of the buffer layer opposite to the surface being in contact with the cathode. In a case where the buffer layer is formed without being in contact with both of the electrodes, it is necessary to provide the electron generating layer on the anode side to be in contact with the buffer layer.

In addition, the second electrode (cathode) 517 is formed on the light emitting substance containing layer 516.

A structure provided with a light emitting element 518 in the space 507 surrounded by the element substrate 510, the sealing substrate 504, and the sealing member 505 is formed by attaching the sealing substrate 504 to the element substrate 510 with the sealing member 505. The space 507 includes a structure filled with the sealing member 505 besides a structure filled with an inert gas (nitrogen, argon, or the like).

An epoxy-based resin is preferably used for the sealing member 505. A material used for these is desirably a material which does not transmit moisture or oxygen as possible. As a material used for the sealing substrate 504, a plastic substrate made of FRP (Fiberglass-Reinforced Plastics), PVF (polyvinyl fluoride), myler, polyester, acrylic, or the like can be used besides a glass substrate or a quartz substrate.

As described above, a light emitting device having a light emitting element formed by the present invention can be obtained.

A light emitting device shown in this embodiment mode can be implemented by freely combining the structures of the light emitting element shown in Embodiment Modes 1 to 3.

Embodiment Mode 5

An electronic device provided with a light emitting device according to the present invention includes: a television device (also simply referred to as a television or a television receiver), a camera such as a digital camera or a digital video camera, a cellular phone unit (also simply referred to as a cellular telephone or a cellular phone), a portable information terminal such as a PDA, a portable game machine, a monitor for a computer, a computer, a sound reproducing device such as a car audio set, an image reproducing device provided with a recording medium such as a home game machine, and the like. Specific examples thereof will be explained with reference to FIGS. 6A to 6E.

Figure 6A:
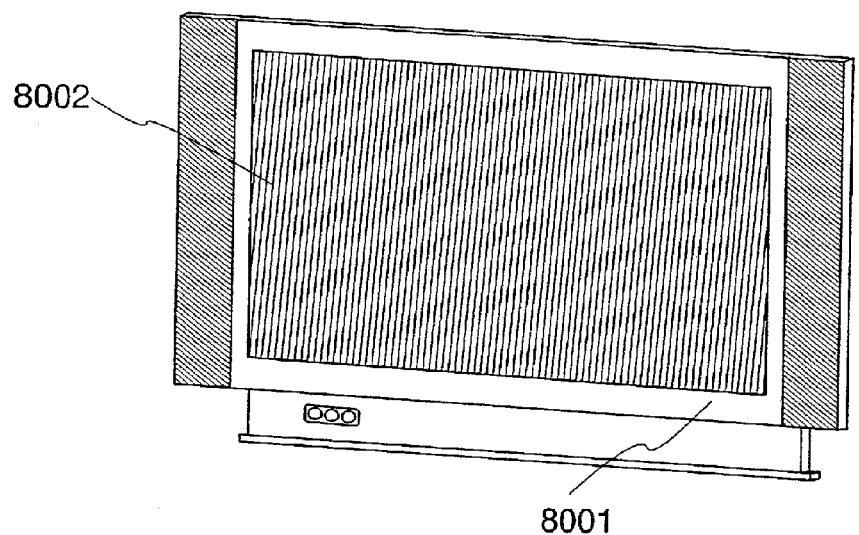
FIGS. 6A to 6E are views showing an electronic device of the present invention.

A television device shown in FIG. 6A includes a main body 8001, a display portion 8002, and the like. The light emitting device of the present invention can be applied to the display portion 8002. As a result, it enables not only to flow a sufficient current at a low voltage, but also to obtain sufficient luminescence properties. Further, optical characteristics can be enhanced by freely designing a thickness. According to these, a television device driven at a lower drive voltage can be provided.

Figure 6B:
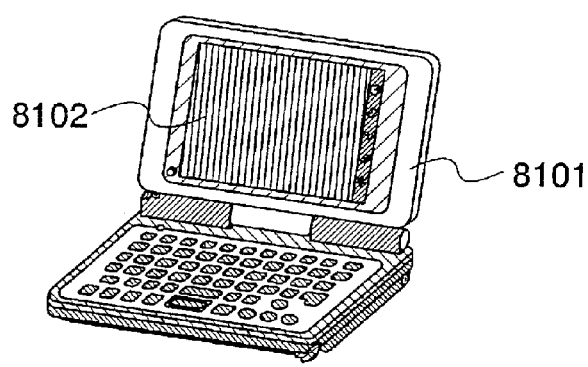

A portable information terminal device shown in FIG. 6B includes a main body 8101, a display portion 8102, and the like. The light emitting device of the present invention can be applied to the display portion 8102. As a result, it enables not only to flow a sufficient current at a low voltage, but also to obtain sufficient luminescence properties. Further, optical characteristics can be enhanced by freely designing a thickness. According to these, a portable information terminal device driven at a lower drive voltage can be provided.

Figure 6C:
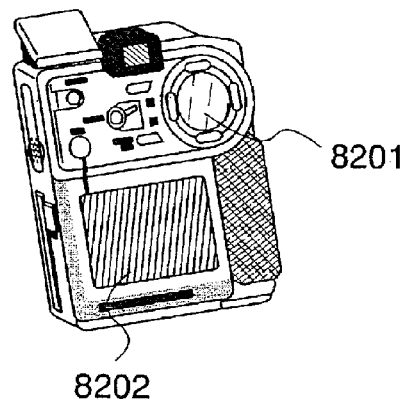

A digital video camera shown in FIG. 6C includes a display portion 8201, a display portion 8202, and the like. The light emitting device of the present invention can be applied to the display portion 8202. As a result, it enables not only to flow a sufficient current at a low voltage, but also to obtain sufficient luminescence properties. Further, optical characteristics can be enhanced by freely designing a thickness. According to these, a digital video camera driven at a lower drive voltage can be provided.

Figure 6D:
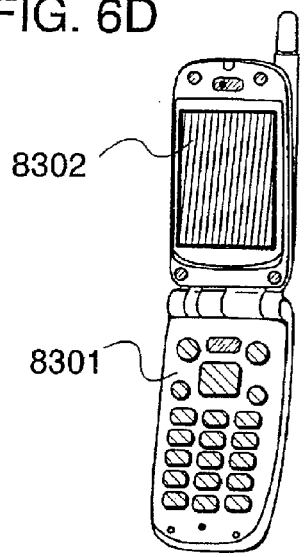

A cellular telephone shown in FIG. 6D includes a main body 8301, a display portion 8302, and the like. The light emitting device of the present invention can be applied to the display portion 8302. As a result, it enables not only to flow a sufficient current at a low voltage, but also to obtain sufficient luminescence properties. Further, optical characteristics can be enhanced by freely designing a thickness. According to these, a cellular telephone driven at a lower drive voltage can be provided.

Figure 6E:
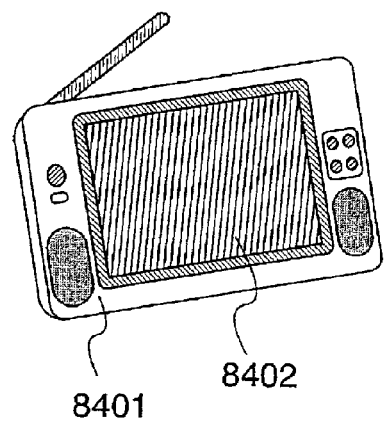

A portable television device shown in FIG. 6E includes a main body 8401, a display portion 8402, and the like. The light emitting device of the present invention can be applied to the display portion 8402. As a result, it enables not only to flow a sufficient current at a low voltage, but also to obtain sufficient luminescence properties. Further, optical characteristics can be enhanced by freely designing a thickness. According to these, a portable television device driven at a lower drive voltage can be provided. Further, the light emitting device of the present invention can be applied to various types of portable television devices such as a small-sized television device incorporated in a portable terminal such as a cellular telephone, a medium-sized television device which is portable, and a large-sized television device (for example, 40 inches or more).

As described above, an electronic device driven at a lower drive voltage can be provided according to the light emitting device of the present invention which enables not only to flow a sufficient current at a low voltage, but also to obtain sufficient luminescence properties and to enhance optical characteristics by freely designing a thickness.

Embodiment 1

In this embodiment, a manufacturing method and a measurement result of element characteristics of a light emitting element (a structure in which a buffer layer is provided to be in contact with a first electrode (anode)) having an element structure shown in Embodiment Mode 1, in which a buffer layer, a hole transporting layer, a light emitting layer, an electron transporting layer, an electron injecting layer, and a second electrode are sequentially stacked from the first electrode side will be shown in FIGS. 7 to 11.

Figure 7:
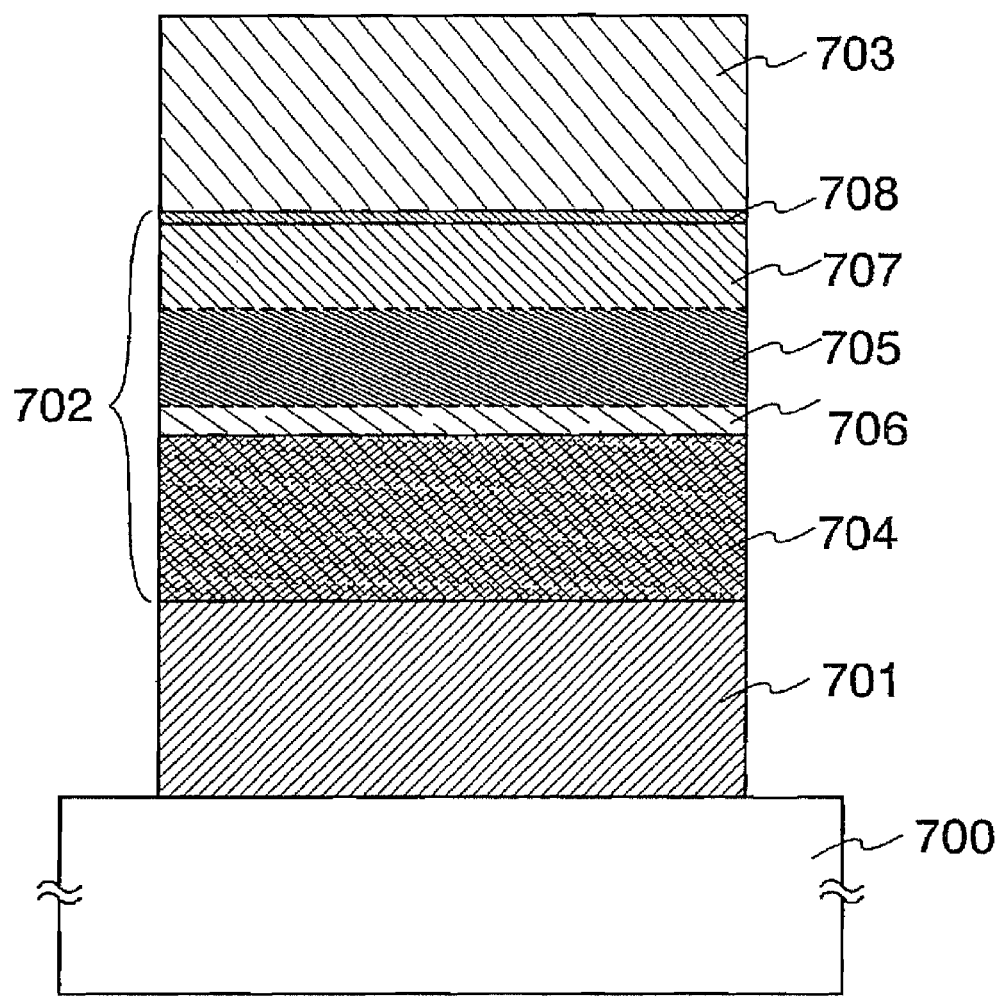
FIG. 7 is a view showing an element structure of a light emitting element explained in Embodiment 1.

First, a first electrode 701 of the light emitting element is formed on a substrate 700 as shown in FIG. 7. In this embodiment, the first electrode 701 serves as an anode. The first electrode 701 is made of ITO which is a transparent conductive film and formed to have a thickness of 110 nm by a sputtering method. As a sputtering method used herein, a bipolar sputtering method, an ion beam sputtering method, or an opposite target sputtering method, and the like are given. The size of the electrode was set to be 2 mm×2 mm.

Subsequently, a light emitting substance containing layer 702 is formed on the first electrode (anode) 701. In this embodiment, the light emitting substance containing layer 702 has a stacked structure of a buffer layer 704, a hole transporting layer 706, a light emitting layer 705, an electron transporting layer 707, and an electron injecting layer 708 from the first electrode side, and especially, has a feature that the light emitting substance containing layer 702 is made of a composite material for a light emitting element fowled by aromatic hydrocarbon containing at least one vinyl skeleton and metal oxide is used for the buffer layer 704.

A substrate provided with the first electrode 701 is fixed to a substrate holder of a vacuum deposition system which is commercially available so that a surface, on which the first electrode 701 is formed, is placed downward. A compound (DPVBi) represented by a structural formula (I) in Embodiment Mode 1 as aromatic hydrocarbon containing at least one vinyl skeleton is put in one of evaporation sources provided inside the vacuum deposition system, and molybdenum oxide as metal oxide is put in the other evaporation source to form the buffer layer 704 to have a thickness of 120 nm by a co-evaporation method using resistance heating. A weight ratio of DPVBi to molybdenum oxide in the buffer layer 704 which is formed here was set to be 1:0.5 (molar ratio is set to be 1:1.8) (=DPVBi:molybdenum oxide).

Next, the hole transporting layer 706 is formed by a material superior in a hole transporting property. Here, as the material superior in a hole transporting property, NPB is formed to have a thickness of 10 nm by a deposition method using resistance heating.

Then, the light emitting layer 705 is formed. In the light emitting layer 705, holes and electrons are recombined to emit light. Here, $Alq_3$ and coumarin 6 are formed to have a thickness of 37.5 nm by a co-evaporation method similar to the buffer layer. A weight ratio of $Alq_3$ to coumarin 6 was set to be 1:0.01 (molar ratio is set to be 1:0.013) (=$Alq_3$: coumarin 6). According to this, coumarin 6 is included in a layer made of $Alq_3$ by being dispersed.

Then, the electron transporting layer 707 is formed. As the electron transporting layer 707, $Alq_3$ is formed to have a thickness of 37.5 nm by a deposition method similar to the hole transporting layer 706.

Then, the electron injecting layer 708 is formed. As the electron injecting layer 708, LiF is formed to have a thickness of 1 nm by a deposition method similar to the hole transporting layer 706.

As described above, after forming the light emitting substance containing layer 702 having a stacked structure, a second electrode 703 serving as a cathode is formed by a sputtering method or a deposition method. In this embodiment, aluminum is formed on the light emitting substance containing layer 702 to have a thickness of 200 nm by a sputtering method to obtain the second electrode 703.

Accordingly, a light emitting element of the present invention is formed. In this embodiment, although a case where the first electrode formed on the substrate is made of an anode material and serves as an anode is explained, the present invention is not limited to this, and the first electrode can be made of a cathode material and made to serve as a cathode. However, in this case (a case of reversing the anode and cathode), a stacking sequence of the light emitting substance containing layer is reversed from a case shown in this embodiment. Further, in this embodiment, the first electrode 701 is a transparent electrode and has a structure in which light generated in the light emitting layer 705 is made to be emitted from the first electrode 701 side; however, the present invention is not limited to this, and a structure in which light is made to be emitted from the second electrode 703 side can also be employed by selecting a suitable material for ensuring transmittance.

Next, a measurement result of element characteristics of a light emitting element shown in FIG. 7 is indicated by plots represented by white circles (light emitting element (2)) in FIGS. 8 to 11.

Figure 8:
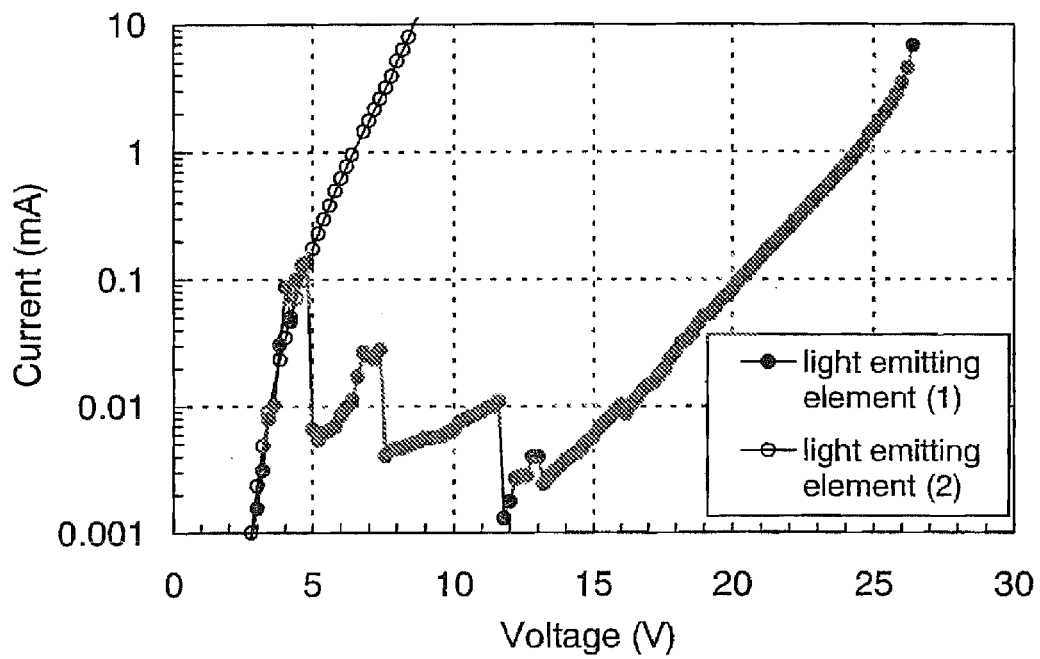
FIG. 8 is a graph showing element characteristics of a light emitting element.

In current-voltage characteristics shown in FIG. 8, a current of approximately 1.0 mA flowed when a voltage of 6V was applied. From this result, a state is continued where a current is injected sufficiently in the light emitting substance containing layer 702 of the light emitting element even in a case of a low voltage by providing the buffer layer 704 of the present invention.

Figure 9:
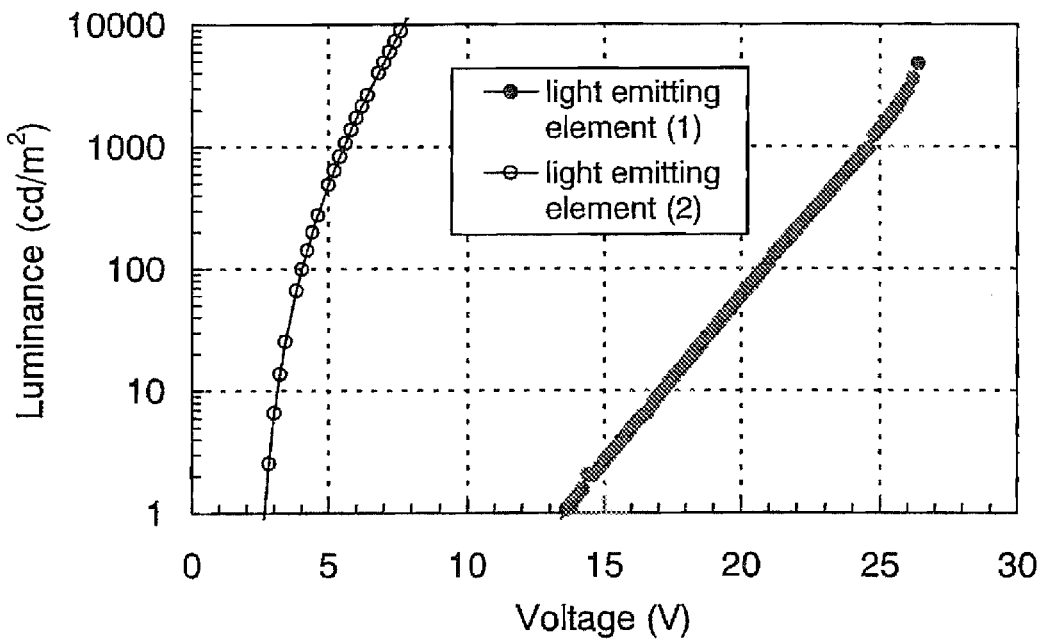
FIG. 9 is a graph showing element characteristics of a light emitting element.

In luminance-voltage characteristics shown in FIG. 9, luminance of approximately 1000 cd/m$^2$ was obtained when a voltage of 6V was applied. From this result, it is revealed that a favorable effect can be obtained with respect to luminance characteristics to a voltage by providing the buffer layer 704 of the present invention.

Figure 10:
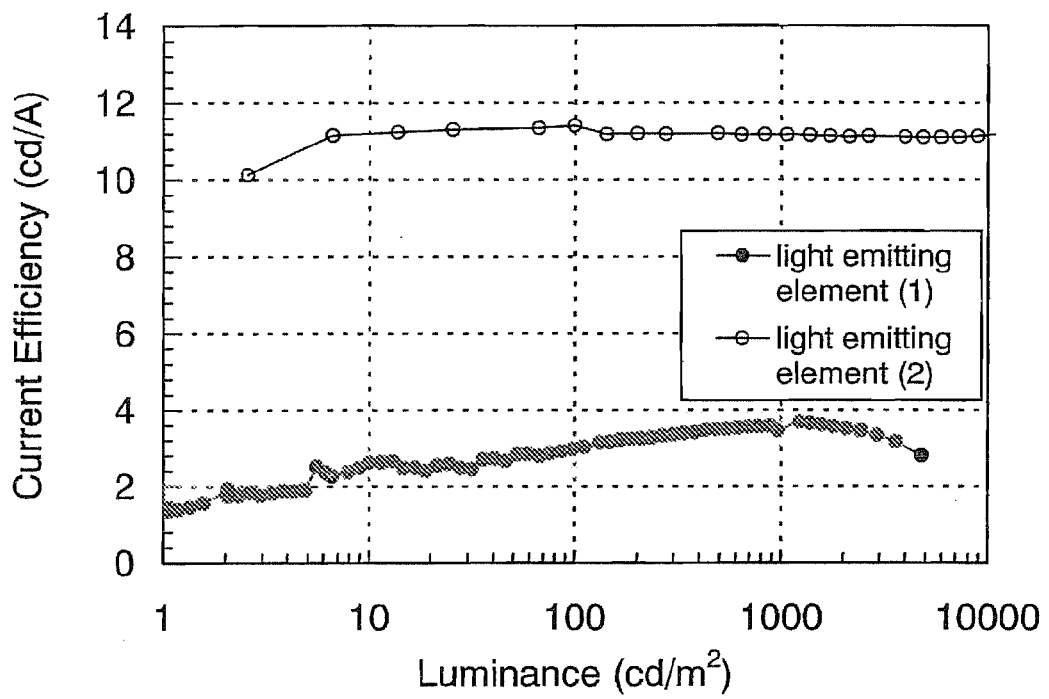
FIG. 10 is a graph showing element characteristics of a light emitting element.
Figure 11:
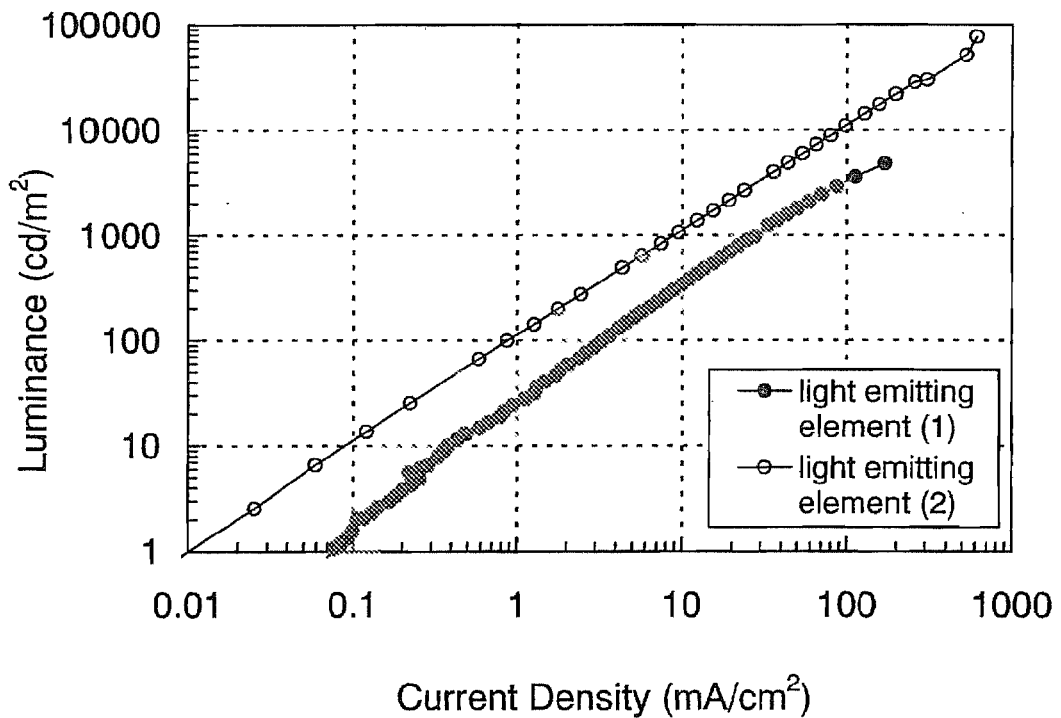
FIG. 11 is a graph showing element characteristics of a light emitting element.

In current efficiency-luminance characteristics shown in FIG. 10, current efficiency was approximately 11.5 cd/A in a case where luminance of 100 cd/m$^2$ was obtained. In luminance-current density characteristics shown in FIG. 11, luminance of approximately 10000 cd/m$^2$ was obtained in a case where current density was 100 mA/cm$^2$. From these results, it can be said that holes and electrons exist in a favorable balance, which is a state where recombination can be conducted effectively, in the light emitting substance containing layer 702 of the light emitting element.

Comparative Example 1

In contrast, measurement was conducted with respect to element characteristics of a light emitting element (referred to as a light emitting element (1)) manufactured by using DPVBi as aromatic hydrocarbon containing at least one vinyl skeleton for the buffer layer 704 in the element structure which is measured in Embodiment 1. The light emitting element (1) which is measured here is manufactured so as to have the same structure as the light emitting element shown in FIG. 7 of Embodiment 1 except for the buffer layer 704. Specifically, a first electrode: ITO (110 nm), a buffer layer: DPVBi (120 nm), a hole transporting layer: NPS (10 nm), a light emitting layer: Alq$_3$+coumarin 6 (37.5 nm), an electron transporting layer: Alq$_3$ (37.5 nm), an electron injecting layer: LiF (1 nm), and a second electrode: Al (200 nm) are stacked in this order. The result is represented by plots indicated by black circles (light emitting element (1)) in FIGS. 8 to 11.

In current-voltage characteristics shown in FIG. 8, a voltage of approximately 24 V was necessary to be applied in order to flow a current of approximately 1.0 mA. It can be said that a current does not easily injected into a light emitting substance containing layer of the light emitting element compared with the light emitting element (2) in which the same amount of current can flow by applying a voltage of approximately 6 V.

In luminance-voltage characteristics shown in FIG. 9, a voltage of approximately 25 V is necessary to be applied to obtain luminance of approximately 1000 cd/m$^2$. It is revealed that luminance characteristics of an element is influenced on a state where a current does not easily injected into a light emitting substance containing layer 702 of the light emitting element compared with the light emitting element (2) in which the same luminance can be obtained by applying a voltage of approximately 6 V.

In current efficiency-luminance characteristics shown in FIG. 10, current efficiency was approximately 3.0 cd/A in a case where luminance of 100 cd/m$^2$ was obtained. In luminance-current density characteristics shown in FIG. 11, luminance of only approximately 5000 cd/m$^2$ was obtained in a case where current density was 100 mA/cm$^2$. It can be said that these results are caused by a state where holes which are necessary for recombination are not injected sufficiently because holes and electrons do not exist in a favorable balance in a layer including the light emitting element in the light emitting element (1).

From these results, according to the light emitting element of the present invention, a hole injecting property in a light emitting substance containing layer can be enhanced by providing a buffer layer made of a composite material for a light emitting element formed by aromatic hydrocarbon containing at least one vinyl skeleton and metal oxide; therefore, a drive voltage of the light emitting element can be reduced and element characteristics such as luminance characteristics can be enhanced.

This application is based on Japanese Patent Application serial No. 2005-147967 field in Japan Patent Office on May 20, 2005, the entire contents of which are hereby incorporated by reference.

What is claimed is:

1. A light emitting device comprising:
   an anode;
   a cathode;
   a buffer layer provided between the anode and the cathode; and
   an electron generating layer provided between the anode and the cathode,
   wherein the buffer layer comprises an aromatic hydrocarbon including at least one vinyl skeleton and comprises a metal oxide,
   wherein the buffer layer is in contact with the cathode, and
   wherein the metal oxide is one selected from the group consisting of molybdenum oxide, vanadium oxide, ruthenium oxide, and rhenium oxide.

2. The light emitting device according to claim 1,
   wherein the electron generating layer is disposed over the anode, and
   wherein the buffer layer is disposed over the electron generating layer.

3. The light emitting device according to claim 1, wherein the aromatic hydrocarbon including at least one vinyl skeleton is represented by any one of the following structural formulas (1)-(5), (1) 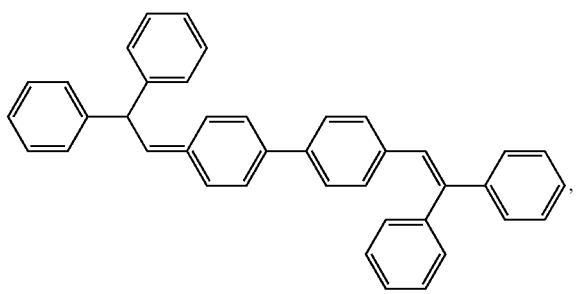

(2) 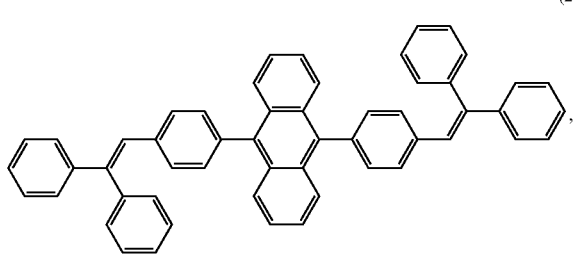

(3) 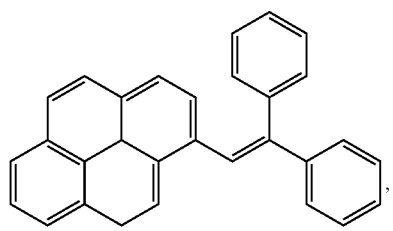

(4) 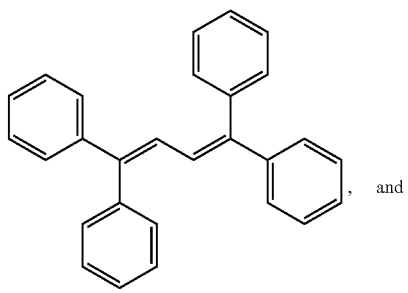, and (5) 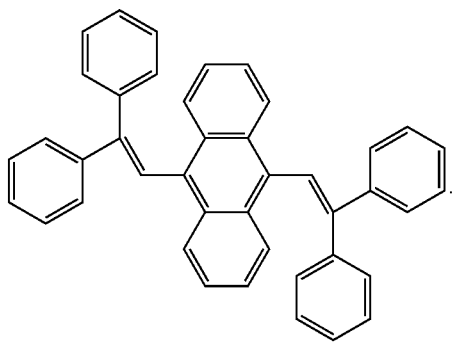

4. The light emitting device according to claim 1, wherein the aromatic hydrocarbon including at least one vinyl skeleton has hole mobility of $1\times10^{-6}$ cm$^2$/Vs or more.

5. The light emitting device according to claim 1, wherein the electron generating layer comprises a substance selected from the group consisting of an electron transporting substance and a bipolar substance, and comprises a substance selected from the group consisting of alkali metal, alkaline earth metal, alkali metal oxide, alkaline earth metal oxide, alkali metal fluoride and alkaline earth metal fluoride.

6. The light emitting device according to claim 1, wherein the light emitting device is incorporated into an electronic device selected from the group consisting of a camera such as a digital camera and a digital video camera, a cellular phone, a portable information terminal, a portable game machine, a monitor for a computer, a computer, a laptop personal computer, a car audio set, an image reproducing device, a car navigation system, a television device and portable television device.

7. The light emitting device according to claim 1, wherein the buffer layer serves as a barrier film.

8. The light emitting device according to claim 1, further comprising a second buffer layer, wherein the second buffer layer is in contact with the electron generating layer.

9. A light emitting device comprising:
an anode;
a cathode;
a light emitting layer interposed between the anode and the cathode;
a buffer layer provided between the anode and the cathode; and
an electron generating layer provided between the anode and the cathode,
wherein the buffer layer comprises an aromatic hydrocarbon including at least one vinyl skeleton and comprises a metal oxide,
wherein the buffer layer is in contact with the cathode, and
wherein the metal oxide is one selected from the group consisting of molybdenum oxide, vanadium oxide, ruthenium oxide, and rhenium oxide.

10. The light emitting device according to claim 9,
wherein the electron generating layer is disposed over the anode, and
wherein the buffer layer is disposed over the electron generating layer.

11. The light emitting device according to claim 9, wherein the aromatic hydrocarbon including at least one vinyl skeleton is represented by any one of the following structural formulas (1)-(5), (1) 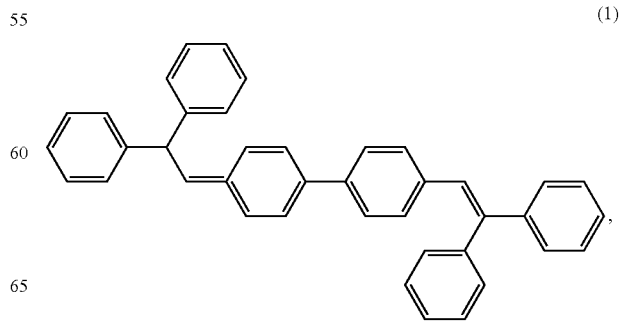

-continued

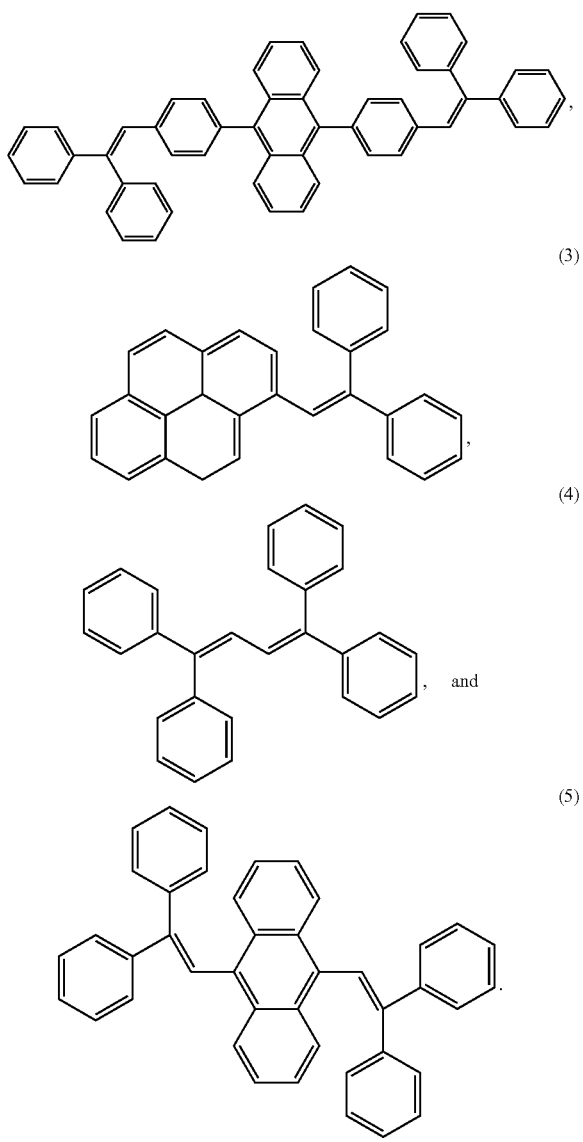

12. The light emitting device according to claim 9, wherein the aromatic hydrocarbon including at least one vinyl skeleton has hole mobility of $1\times10^{-6}$ cm$^2$/Vs or more.

13. The light emitting device according to claim 9, wherein the electron generating layer comprises a substance selected from the group consisting of an electron transporting substance and a bipolar substance, and comprises a substance selected from the group consisting of alkali metal, alkaline earth metal, alkali metal oxide, alkaline earth metal oxide, alkali metal fluoride and alkaline earth metal fluoride.

14. The light emitting device according to claim 9, wherein the light emitting device is incorporated into an electronic device selected from the group consisting of a camera such as a digital camera and a digital video camera, a cellular phone, a portable information terminal, a portable game machine, a monitor for a computer, a computer, a laptop personal computer, a car audio set, an image reproducing device, a car navigation system, a television device and portable television device.

15. The light emitting device according to claim 9, wherein the buffer layer serves as a barrier film.

16. The light emitting device according to claim 9, further comprising a second buffer layer, wherein the second buffer layer is in contact with the electron generating layer.

17. A light emitting device comprising:
an anode;
a cathode;
a layer containing a light emitting substance, the layer being interposed between the anode and the cathode;
a buffer layer provided between the anode and the cathode; and
an electron generating layer provided between the anode and the cathode,
wherein the layer includes at least one of a light emitting layer, a hole transporting layer, an electron transporting layer, and an electron injecting layer,
wherein the buffer layer comprises an aromatic hydrocarbon including at least one vinyl skeleton and comprises a metal oxide,
wherein the buffer layer is in contact with the cathode, and
wherein the metal oxide is one selected from the group consisting of molybdenum oxide, vanadium oxide, ruthenium oxide, and rhenium oxide.

18. The light emitting device according to claim 17,
wherein the electron generating layer is disposed over the anode, and
wherein the buffer layer is disposed over the electron generating layer.

19. The light emitting device according to claim 17, wherein the aromatic hydrocarbon including at least one vinyl skeleton is represented by any one of the following structural formulas (1)-(5),

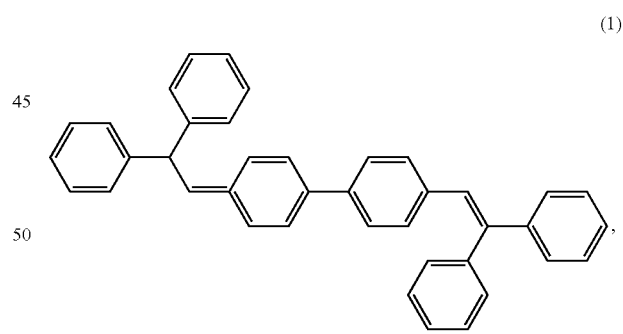

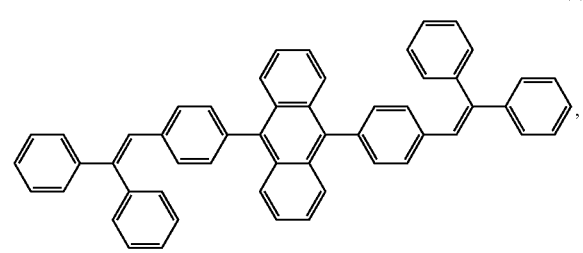

-continued

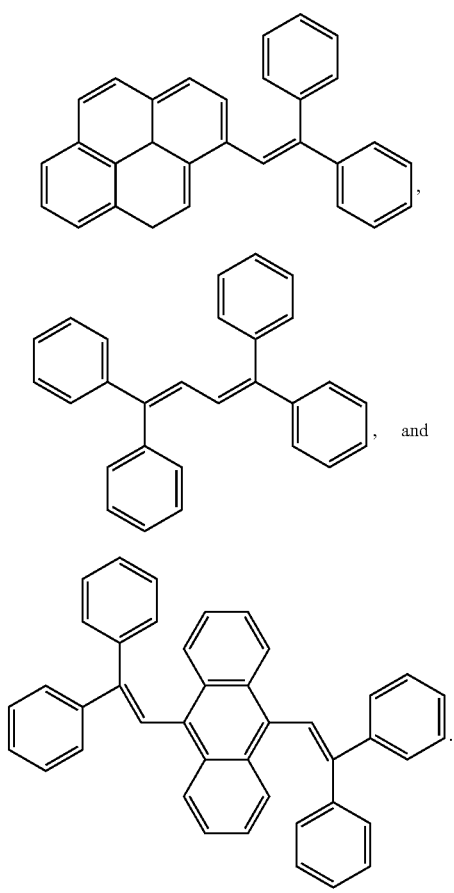

20. The light emitting device according to claim 17, wherein the aromatic hydrocarbon including at least one vinyl skeleton has hole mobility of $1\times10^{-6}$ cm$^2$/Vs or more.

21. The light emitting device according to claim 17, wherein the electron generating layer comprises a substance selected from the group consisting of an electron transporting substance and a bipolar substance, and comprises a substance selected from the group consisting of alkali metal, alkaline earth metal, alkali metal oxide, alkaline earth metal oxide, alkali metal fluoride and alkaline earth metal fluoride.

22. The light emitting device according to claim 17, wherein the light emitting device is incorporated into an electronic device selected from the group consisting of a camera such as a digital camera and a digital video camera, a cellular phone, a portable information terminal, a portable game machine, a monitor for a computer, a computer, a laptop personal computer, a car audio set, an image reproducing device, a car navigation system, a television device and portable television device.

23. The light emitting device according to claim 17, wherein the buffer layer serves as a barrier film.

24. The light emitting device according to claim 17, further comprising a second buffer layer, wherein the second buffer layer is in contact with the electron generating layer.

* * * * *